United States Patent [19]
Jansen et al.

[11] Patent Number: 5,559,419
[45] Date of Patent: Sep. 24, 1996

[54] METHOD AND APPARATUS FOR TRANSDUCERLESS FLUX ESTIMATION IN DRIVES FOR INDUCTION MACHINES

[75] Inventors: Patrick L. Jansen, Boise, Id.; Robert D. Lorenz, Madison, Wis.

[73] Assignee: Wisconsin Alumni Research Foundation, Madison, Wis.

[21] Appl. No.: 263,142

[22] Filed: Jun. 21, 1994

Related U.S. Application Data

[63] Continuation-in-part of Ser. No. 173,405, Dec. 22, 1993.
[51] Int. Cl.$^6$ .................................................. H02P 5/40
[52] U.S. Cl. ........................ 318/808; 318/804; 318/807; 331/31
[58] Field of Search ......................... 318/701, 721, 318/729, 804, 811, 806, 810, 809, 803, 805, 808; 331/22, 31, 18, 30

[56] References Cited

U.S. PATENT DOCUMENTS

| | | |
|---|---|---|
| 3,597,646 | 8/1971 | Lawrenson . |
| 3,611,138 | 10/1971 | Winebrener . |
| 3,943,504 | 3/1976 | Vosicky . |
| 4,127,819 | 11/1978 | Keane ........................ 325/423 |
| 4,149,114 | 4/1979 | Gorjan . |
| 4,447,787 | 5/1984 | Schwesig et al. ........................ 318/803 |
| 4,450,396 | 5/1984 | Hill et al. . |
| 4,612,486 | 9/1986 | Ban et al. . |
| 4,761,703 | 8/1988 | Kliman et al. ........................ 318/806 |
| 5,029,265 | 7/1991 | Staats ........................ 318/729 |
| 5,053,690 | 10/1991 | Mutch et al. ........................ 318/811 |
| 5,070,264 | 12/1991 | Conrad . |
| 5,144,564 | 9/1992 | Naidu et al. ........................ 318/721 |
| 5,196,775 | 3/1993 | Harris et al. . |
| 5,256,923 | 10/1993 | Bartos et al. ........................ 318/701 |
| 5,272,429 | 12/1993 | Lipo et al. ........................ 318/808 |
| 5,294,876 | 3/1994 | Jönsson ........................ 318/809 |
| 5,334,923 | 8/1994 | Lorenz et al. . |

OTHER PUBLICATIONS

Robert D. Lorenz, et al., "High–Resolution Velocity Estimation for All–Digital, ac Servo Drives," IEEE–IAS Annual Meeting, Oct. 1988, pp. 363–368.

John G. Bollinger, et al., *Computer Control of Machines and Process*(book), Addison–Wesley Publishing Company, Reading, MA, 1988, pp. 275–278.

Analog Devices 1989/90 Data Conversion Products Databook, Synchro & Resolver Converters, AD2S90 Resolver–To–Digital Converter.

Robert M. Cuzner, et al., "Application of Non–Linear Observers for Rotor Position Detection on an Induction Motor Using Machine Voltages and Currents," Proc. IEEE–IAS Annual Meeting, Oct. 1990.

P. L. Jansen, et al., "A Physically Insightful Approach to the Design and Accuracy Assessment of Flux Observers for Field Oriented Induction Machine Drives," Proc. IEEE–IAS Annual Meeting, Oct. 1992, pp. 570–577.

(List continued on next page.)

*Primary Examiner*—John W. Cabeca
*Attorney, Agent, or Firm*—Foley & Lardner

[57] ABSTRACT

Power is provided to the stator windings of an AC induction machine which includes a component at the fundamental drive frequency for the machine and a superimposed signal component which is at a substantially higher frequency than the drive power. The fundamental drive power is provided at a level which results in saturation in the stator which follows the magnetic flux vector. The stator response at the signal frequency is then detected to provide a correlation between the response at the signal frequency and the magnetic flux vector position. The detection of the response at the signal frequency is preferably carried out by a heterodyne detection process, by mixing signals at the signal frequency with the measured stator currents, and filtering the mixed signals to isolate the signal indicative of the flux vector position.

26 Claims, 13 Drawing Sheets

OTHER PUBLICATIONS

P. L. Jansen, et al., "Observer–Based Direct Field Orientation for Both Zero and Very High Speed Operation," PCC–Yokohama '93, Yokohama, Japan, Apr. 1993.

P. L. Jansen, et al., "Observer–Based Direct Field Orientation: Analysis and Comparison of Alternative Methods," IEEE–IAS '93 Annual Meeting, Toronto, Canada, Oct. 1993.

M. Schroedl, "Operation of the Permanent Magnet Synchronous Machine Without A Mechanical Sensor," Proc. Int. Conf. on Power Electronics and Variable Speed Drives, IEE, London, England, Jul. 1990, pp. 51–56.

Manfred Schroedl, "Control of a Permanent Magnet Synchronous Machine Using a New Position–Estimator," ICEM, Boston, Aug. 1990, pp. 1218–1224.

K. J. Binns, et al., "Implicit Rotor–Position Sensing Using Motor Windings for a Self–Commutating Permanent–Magnet Drive System," IEE Proceedings–B, vol. 138, No. 1, Jan. 1991, pp. 28–34.

Manfred Schroedl, "Sensorless Control of Induction Motors at Low Speed and Standstill," ICEM, Manchester, 1992, pp. 863–867.

M. Schroedl, et al., "Induction Motor Drive For Electric Vehicles Without Speed–and Position Sensors," European Power Electronics Conference, Brighton, England, Sep. 13, 1993, pp. 271–275.

METHOD AND APPARATUS FOR TRANSDUCERLESS FLUX ESTIMATION IN DRIVES FOR INDUCTION MACHINES

This invention was made with United States Government support awarded by NSF, Grant No. DDM 89-12361. The United States Government has certain rights in this invention.

CROSS REFERENCE TO RELATED APPLICATION

This application is a continuation-in-part of pending application Ser. No. 08/173,405, filed Dec. 22, 1993, the disclosure of which is incorporated herein by reference.

FIELD OF THE INVENTION

This invention pertains generally to the field of motor drive and control systems and to the determination of magnetic flux vector location for torque control in induction machines.

BACKGROUND OF THE INVENTION

A variety of drive systems for AC machines utilizing electronic switching to control the power applied to the machines are presently available commercially. These AC machine drives allow the torque and/or speed of the machine to be controlled to meet various requirements. Such machine drives typically require mechanical shaft transducers to provide feedback of shaft position and/or velocity. Feedback is generally required both for torque control (i.e., field orientation or vector control) and trajectory tracking, especially for control at zero and low speeds. However, shaft transducers and the associated wiring to provide the signals from the shaft transducers to the electronic drive add significantly to the cost and rate of failure of the system, and also add to the total volume and mass of the machine at the work site. Because induction machines are generally lower in cost and more rugged than other machine types, to a large extent the advantages of induction machines are the most compromised by the addition of such transducers.

Consequently, the desirability of eliminating position or velocity transducers in motor motion control applications has long been recognized. Several approaches have been proposed to allow estimation of the rotor position or velocity. However, if only torque control (and/or moderate accuracy speed control) is required by an application, knowledge of the magnetic flux vector location (and/or amplitude) is sufficient. Conventional methods of flux estimation that do not rely upon measured shaft position or velocity feedback fail at zero and low speeds.

SUMMARY OF THE INVENTION

In accordance with the present invention, a drive system for polyphase induction machines provides power to the stator windings of the machine which includes a component at the fundamental drive frequency and a superimposed signal component which is at a higher frequency and lower power than the drive power—preferably a frequency high enough and a power low enough that the signal component does not substantially affect the motion of the rotor. Saturation of the magnetic flux paths within the machine will create a saliency which affects the response of the stator windings to the excitation signal at the signal frequency as a function of the position of the magnetic flux vector. Preferably, the stator transient inductance in induction machines, as seen by the stator windings change as a periodic function of magnetic flux vector position. The stator response at the signal frequency may then be detected and measured to provide a correlation between the magnitude of the response at the signal frequency and the flux vector position. The information on flux vector position as a function of time (and, thus, also information on the angular velocity of the flux vector) can be utilized in a controller to provide appropriate fundamental frequency drive power to the motor to drive it at a desired torque and speed.

The present invention can be carried out utilizing AC machines that are of a symmetric, non-salient rotor construction, such as squirrel-cage induction motors with open or semi-closed rotor and stator slots. Intentional operation of such induction machines at a high flux level will cause saturation of the main flux paths in the stator and the rotor, thereby creating a variation in the stator transient inductance, and hence impedance as seen by the stator windings, as a function of the flux vector location with respect to the stator at the signal frequency.

The detection of the response to the high frequency signal at the stator windings is preferably carried out utilizing a heterodyne process by mixing a polyphase signal which is a function of the injected signal frequency with the polyphase response signal, and filtering the mixed signal to isolate the modulation of the response to the signal frequency, which is correlated with the angular position of the magnetic flux vector. The flux vector position can then be utilized for torque control.

The drive system may include an inverter which can be controlled in a pulse width (or density) modulated manner to provide output voltage to the stator windings at both the fundamental drive frequency and at the signal frequency. The inverter may also be controlled to provide only the fundamental drive frequency power to the stator, and a separate signal generator may be connected to inject the high frequency signal into the stator windings.

The invention may also be embodied in a linear motor.

A particular advantage of this invention is that it provides parameter insensitive, dynamic estimates of the flux vector position and velocity, even at zero and low speeds. Furthermore, the signal injection and demodulation scheme incorporated within this invention operates concurrently with the fundamental drive excitation without interruption of system performance. It also has minimal hardware and computational requirements and is highly robust to signal noise.

Further objects, features and advantages of the invention will be apparent from the following detailed description when taken in conjunction with the accompanying drawings.

DETAILED DESCRIPTION OF THE INVENTION

Figure 1:
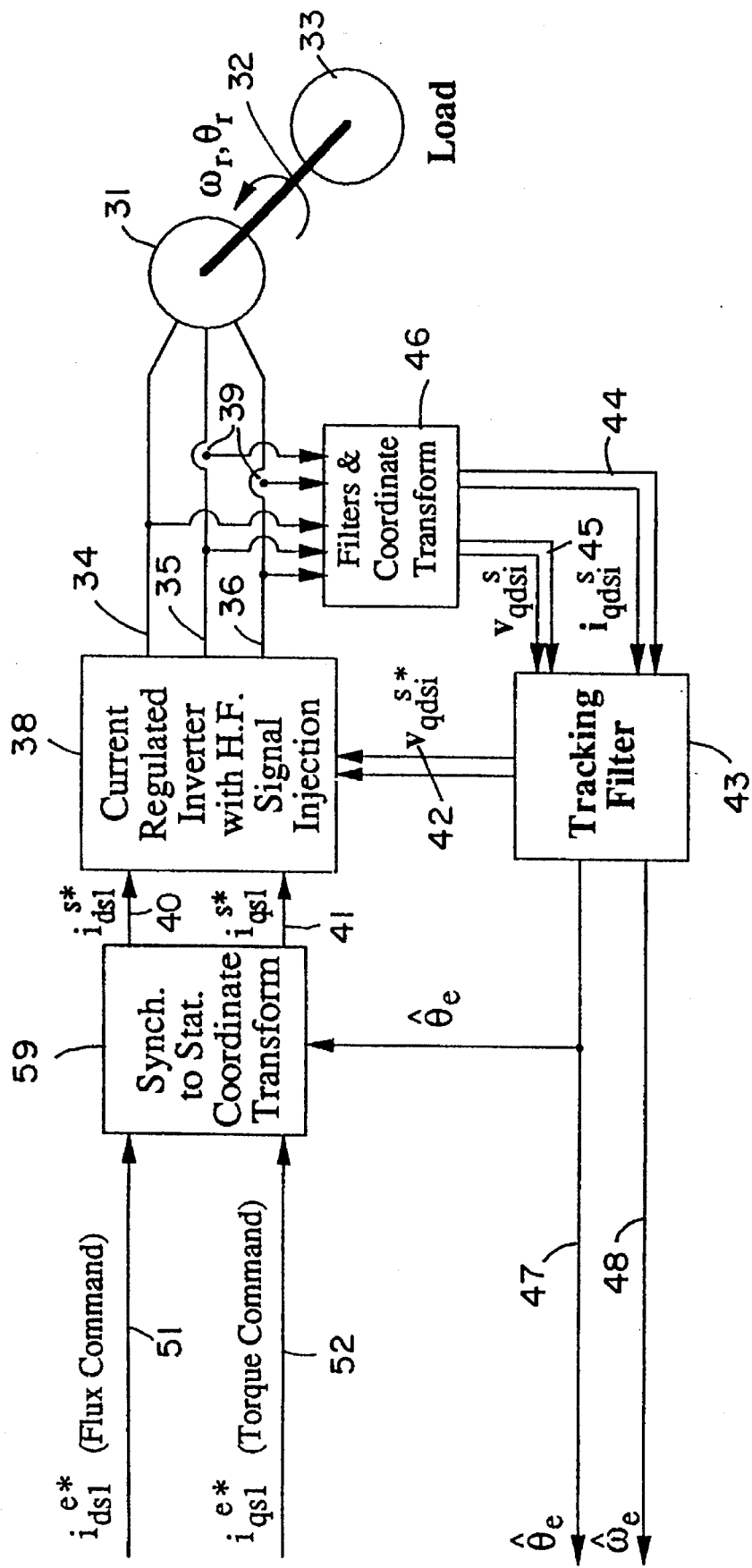
FIG. 1 is a schematic diagram of an exemplary transducerless torque controlled AC machine drive system in accordance with the invention.

A schematic diagram of a transducerless motor drive system in accordance with the invention is shown in FIG. 1. The motor drive system includes an AC motor 31 coupled by a shaft 32 to a load 33. The motor 31 is provided with balanced polyphase (three phase shown) power on output supply lines 34, 35 and 36 from an inverter drive system 38. Inverter systems for AC machines are well known and may be constructed in various ways, depending on the requirements for driving the motor 31. The motor 31 may be any of various types of induction motors, such as polyphase squirrel-cage induction motors, which have characteristics which vary as a function of the magnetic flux vector location, as described further below. The inverter system 38 receives command signals for the fundamental frequency q and d axis currents $i^{s*}_{qs1}$ and $i^{s*}_{ds1}$ on lines 40 and 41, which may be provided as discussed further below, and higher frequency voltage command signals $v^{s*}_{qdsi}$ on lines 42 from a tracking filter 43.

Figure 12:
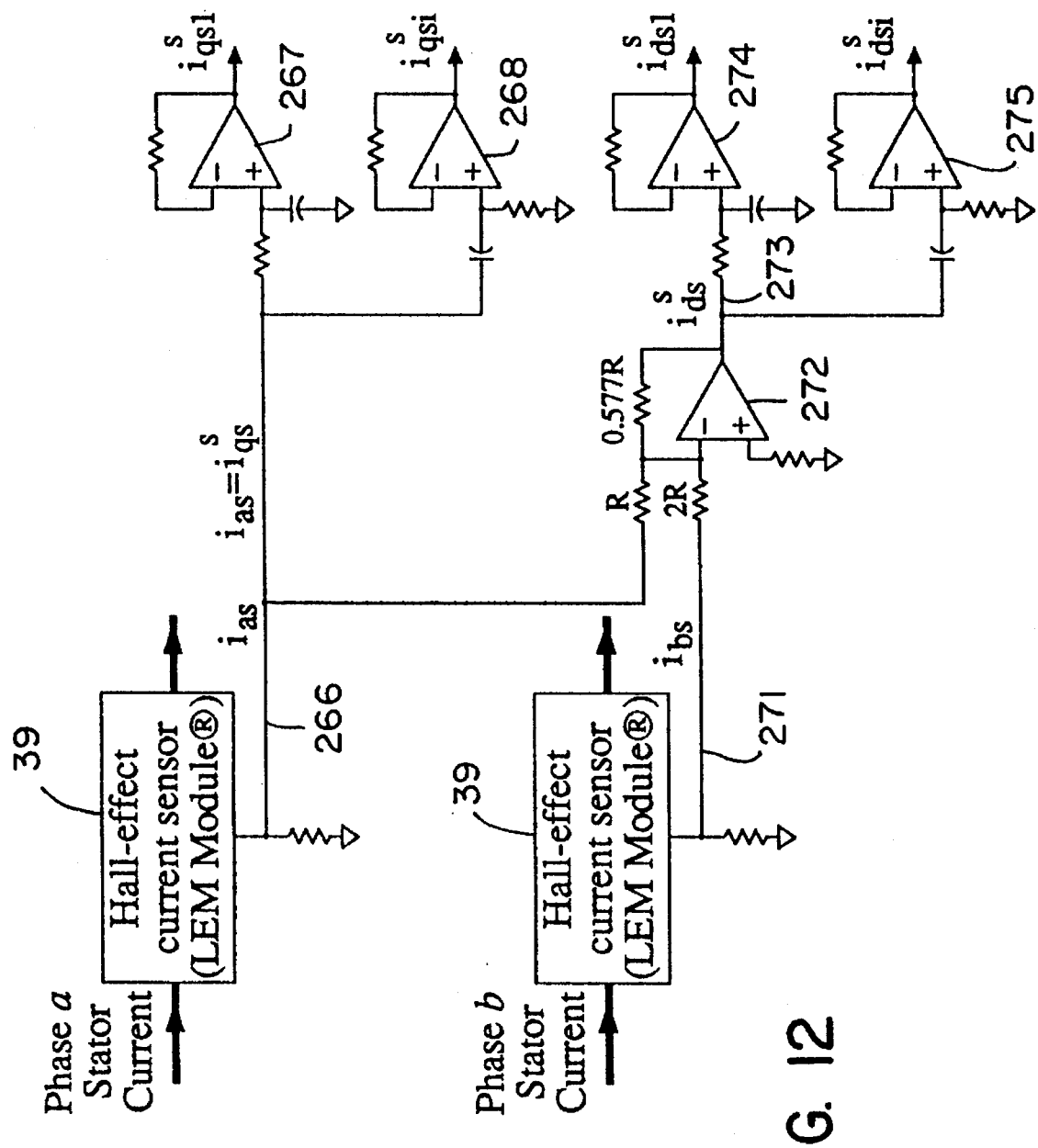
FIG. 12 is a schematic circuit diagram of an exemplary filter and coordinate transform circuit for the AC machine drive system of the invention, providing stator current sensing, three to two phase transformation, and isolation of signal and fundamental current components by first order high pass and low pass filtering.

The tracking filter 43 receives excitation signal (high) frequency current and voltage signals, denoted $i^{s}_{qdsi}$ and $v^{s}_{qdsi}$, on lines 44 and 45 from a filter and coordinate transform circuit 46 which is connected to the lines 34, 35 and 36 to measure the voltages on these lines, and which is also connected to current sensors 39 (e.g., Hall effect sensors or current transformers) to detect the currents in the lines 35 and 36 (and thereby the current in the line 34) The signal $i^{s}_{qdsi}$ is composed of two current signals, $i^{s}_{qsi}$ and $i^{s}_{dsi}$, which are provided by the circuit 46 by a coordinate transformation which converts the measured three phase motor currents to the equivalent q-axis and d-axis currents. The signal $v^{s}_{qdsi}$ is composed of two voltage signals $v^{s}_{qsi}$ and $v^{s}_{dsi}$ which is provided by the circuit 46 through a coordinate transformation which converts the measured voltages on the lines 34, 35 and 36 to the equivalent q-axis and d-axis voltages. The circuit 46 may be of standard construction well known in the art, an example of which for providing the current signals $i^{s}_{qdsi}$ and $i^{s}_{qds1}$ is shown in FIG. 12 as discussed further below. In the present invention, the tracking filter 43, discussed further below, uses information from the signals on the lines 44 and 45 to provide estimates $\hat{\theta}_e$ and $\hat{\omega}_e$ for the flux angular position and velocity, respectively, which are provided as output signals on lines 47 and 48.

The estimate of the flux angular position may be illustratively used to provide a coordinate transformation 59 of the synchronous frame stator current command signals $i^{e*}_{ds1}$ and $i^{e*}_{qs1}$ on lines 51 and 52, respectively, to stationary (i.e. stator) frame quantities on lines 40 and 41 used by the inverter The current command signals $i^{e*}_{ds1}$ and $i^{e*}_{qs1}$ relate to flux and torque commands, respectively, in the well established field orientation (i.e. vector or torque control) schemes for AC machines. It is understood that the particular controller used is a matter of choice, and the tracking filter of the present invention may be used to provide useful flux position and/or velocity information even without a controller. Furthermore, the implementation as depicted in two-phase (i.e. q and d-axis) quantities is optional though preferred. The system can also be implemented in the three-phase machine frame coordinates, or any coordinate system of choice.

The inverter drive system 38 is a means for providing power for driving the motor 31 at the desired fundamental drive frequency, which may vary from low frequencies to running frequencies (which are typically in the range of 60 Hz but may also extend up to 180 Hz or 240 Hz). In addition, a signal power component is provided by the inverter system 38 to the stator windings of the motor 31 which is at a sufficiently high frequency and low amplitude as not to affect substantially the mechanical performance of the motor.

Figure 2:
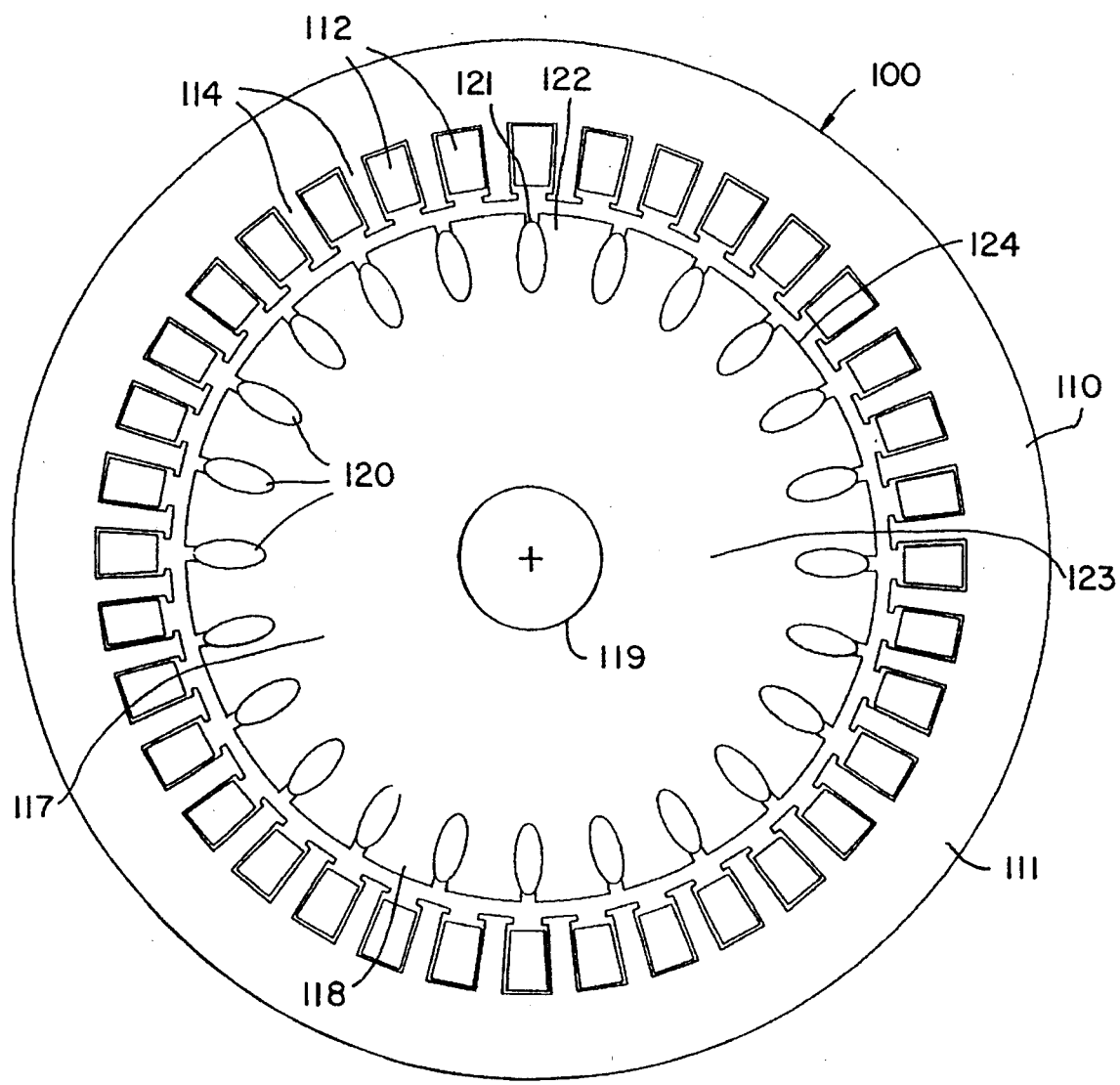
FIG. 2 is a simplified view through a symmetric squirrel-cage induction motor having semi-closed stator and rotor slots.

The motor 31 may be an induction machine of standard design and construction as illustrated for exemplification in cross-section in FIG. 2. The conventional induction motor 100 of FIG. 2 has a stator 110 with a stator core 111 on which are wound symmetrical three phase stator windings 112 between the stator teeth 114. A squirrel-cage rotor 117 has a substantially cylindrical rotor body 118 with rotor core 123 mounted on a shaft 119 which mounts the rotor for rotation within the stator with conventional bearings (not shown). Symmetrical three-phase rotor windings 120, such as squirrel-cage conductive bars, extend through the body at spaced positions around the periphery of the rotor between the rotor teeth 122. Partially open rotor slots 121 of equal opening width are formed over all of the conductive bars 120. The minimum width of these slot openings is preferably selected to minimize the load-induced saturation effects across the openings.

Operation of the induction machine at a high flux level (as illustratively controlled by the current command on line 51 of FIG. 1), may cause saturation in the stator teeth 114, the stator core 111, the rotor teeth 122, and the rotor core 123. The angular location of the saturation coincides with the flux vector location. The saturation will cause a spatial variation in the magnetizing inductance, and also the stator transient inductance. The stator transient inductance, rather than the magnetizing inductance, dominates the stator impedance as seen by the stator windings at the signal frequency. This variation in the stator transient inductance will be seen as a magnetic saliency, corresponding to the flux vector location, that is tracked by this invention. Because the high frequency current and flux components induced in the rotor (associated with the high frequency signal currents, $i^s_{qsi}$ and $i^s_{dsi}$) are forced to the rotor surface 124 by skin effects, the spatial variation in the stator transient inductance (and stator impedance) as seen by the stator windings at the signal frequency will coincide more with saturation in the stator than in the rotor.

Figure 3:
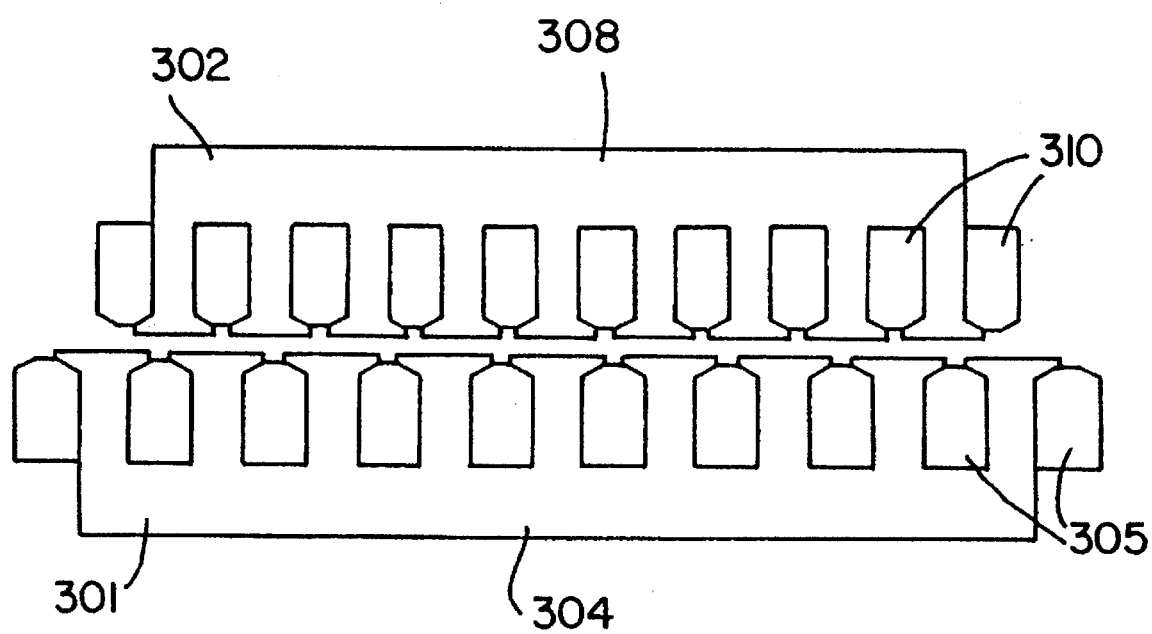
FIG. 3 is a simplified side view of a single sided linear induction motor.

The motor 31 may also be a linear motor; the structures being essentially that of the rotating machine in FIG. 2 but laid flat. An exemplary linear motor is illustrated in FIG. 3. The motor has a long stationary primary structure 301 (corresponding to a stator) and a short, movable secondary structure 302 (corresponding to a rotor). The secondary structure 302 may be supported for linear motion by any desired structure (not shown). For example, the secondary structure 302 could be mounted on wheels, roller bearings, or air bearings, and held in a track (not shown) in a desired relationship to the primary structure 301. The primary structure 301 has a frame 304 formed, e.g. of laminated steel, and a plurality of stator or primary windings 305 in regularly spaced slots. The long primary structure 301 may have several repeating segments, each corresponding to a single stator of a rotary machine laid flat and each segment provided with balanced polyphase power at the drive and signal frequencies in the same manner as discussed above.

The secondary structure 302 has a body and core 308, e.g. of laminated steel mounted on a frame (not shown) for linear motion, with a plurality of rotor or secondary windings 310 in regularly spaced slots. The primary and secondary are designed such that the polyphase primary windings, and the impedance seen by the primary windings, are balanced in the absence of saturation. Saturation in the primary due to operation at a high magnetic flux level will create a magnetic saliency in the form of a spatial variation in the primary transient inductance (and primary impedance seen at the high signal frequency) as seen by the primary windings as a function of the flux location.

Other variations are also apparent; for example, the secondary could be the long and/or the fixed element and the primary the short and/or moving element, the secondary could have conductors on both sides with a primary on both sides of the secondary. It is understood that the drive systems of the present invention may thus be used with either rotating or linear motors. The theory and implementation of the invention are the same for linear machines as for rotating machines.

This invention provides a means of tracking this saturation-induced saliency (i.e. variation in the stator or primary impedance) to obtain a reliable and accurate estimate of the flux vector location via the injection of a balanced polyphase high frequency signal combined with a heterodyning demodulation technique described below.

The applicability of the invention to specific motor designs of the types described above is dependent upon the amount of saturation-induced saliency that can be generated and reliably detected. One means of increasing the amount of saliency is by designing the motors such that the level of saturation in the stator teeth is relatively high over the desired operating range.

Figure 4:
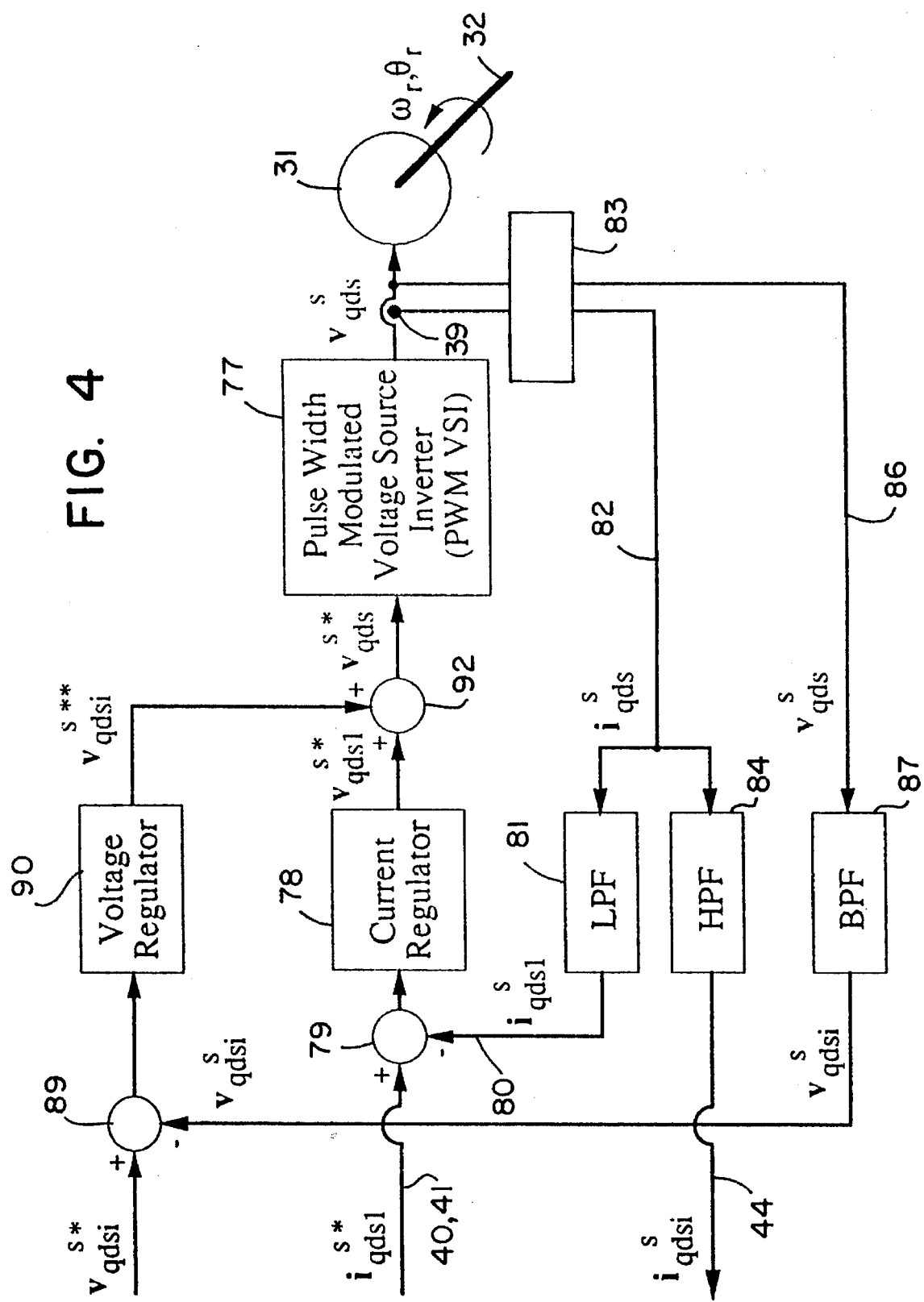
FIG. 4 is a schematic diagram of an inverter system which may be utilized in the invention which has a pulse-width-modulated voltage source inverter to provide the low frequency drive and high frequency signal components.

The introduction of the high frequency signal in the inverter system 38 can be accomplished and controlled in various ways. One manner is illustrated in FIG. 4, in which the inverter system 38 includes a pulse width modulated voltage source inverter 77, the input to which is the sum of the output of a current regulator 78 and the high frequency voltage signal $v^{s**}_{qdsi}$. The current input signals $i^{s*}_{qds1}$ on the lines 40 and 41 are provided to a summing junction 79 which provides the difference between the desired fundamental current $i^{s*}_{qds1}$ and the measured fundamental drive frequency current $i^s_{qds1}$ (provided on a line 80 as received from a low pass filter 81 which may be part of the circuit 46). The low pass filter 81 receives the current feedback signal $i^s_{qds}$ on lines 82 from a coordinate transform circuit 83 which is connected to the current sensors 39 on the stator windings. The signal on the line 82 is also passed through a high pass filter 84 to provide the high frequency components $i^s_{qdsi}$ on the output line 44, which corresponds to the portion of the current measured at the stator windings which is at the higher signal frequency. Although a low pass filter 81 and a high pass filter 84 are shown in FIG. 4 to illustrate the principles of the invention, these filters may be eliminated, or more elaborate filtering and detection techniques for the signal frequency component of the stator current may be used to provide indications of the variation of the amplitude of the high frequency signal component as a function of flux vector position with greater reliability and lower noise, if desired.

In the system of FIG. 4, signals representing the quadrature output voltages $v^s_{qds}$ are also provided from the transform circuit 83 on lines 86 to a band-pass filter 87. The filtered signals $v^s_{qdsi}$ are subtracted at a summing junction 89 from a commanded signal $v^{s*}_{qdsi}$ (e.g., a desired constant amplitude, balanced polyphase signal). The difference is provided to a signal voltage regulator 90 which provides its output to a summing junction 92 where it is summed with the output of the current regulator 78 to provide the voltage signal $v^{s*}_{qds}$ to the voltage source inverter 77.

The high frequency signal injection scheme of FIG. 4, utilizing an optional regulator acting on an error between the commanded and measured signal voltages, minimizes fluctuations and unbalances caused by deadtime effects, dc bus voltage variations, etc. This regulation scheme effectively attempts to compensate for deviations in the PWM voltage source inverter from an ideal polyphase signal voltage source. A proportional-integral (PI) regulator acting in a reference frame synchronous to the signal frequency is a preferred means of implementing the signal voltage regulator. It is noted that all voltages and currents illustrated in FIG. 4 consist of two quantities corresponding to the d and q axes in the stationary frame, though the scheme could be also implemented in three-phase machine frame quantities. It is also noted that components such as the low pass filter 81, high pass filter 84 and bandpass filter 87 may form part of the unit 46, and the feedback components may form part of the tracking filter 43.

The current regulator 78 in a current regulated inverter will attempt to remove the high frequency signal currents, which are deliberately introduced in accordance with the present invention. To avoid attenuation of these currents, the signal frequency should be selected to be either well beyond the regulator bandwidth or the measured signal component at the signal frequency should be removed by appropriate signal processing, (e.g., a notch or low pass filter 81) prior to feedback into the regulator. Alternatively, the current commands on lines 40 and 41 could be augmented with estimates of the signal currents based upon the commanded signal voltages and machine parameter estimates.

Figure 5:
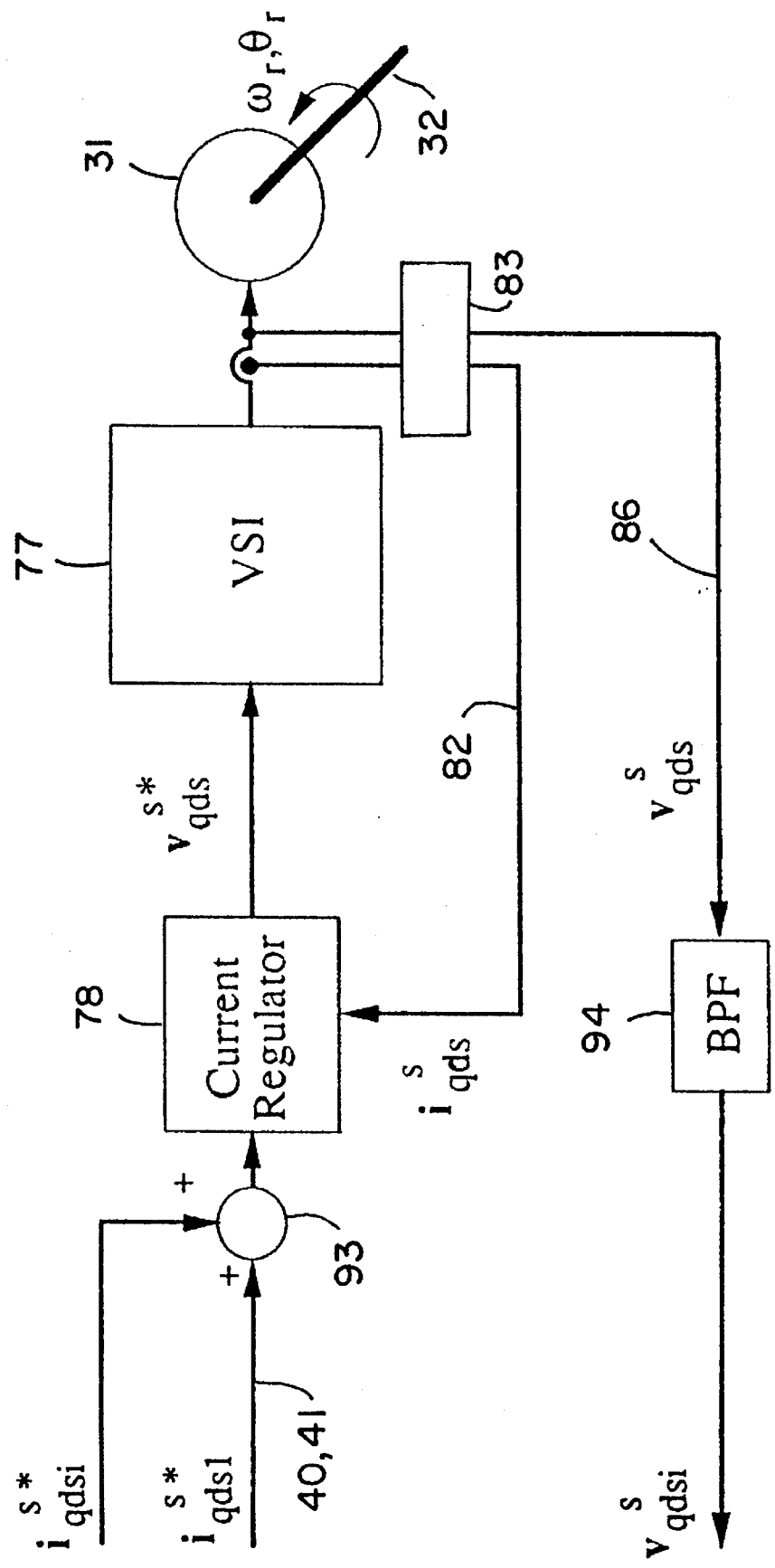
FIG. 5 is a simplified schematic diagram of an inverter system similar to that of FIG. 4 but with current injection utilizing a current regulated voltage source inverter.

Alternatively, the high-frequency signal can be introduced as balanced polyphase currents rather than voltages. A signal current injection utilizing a current-regulated voltage source inverter (VSI) to generate both the high-power main excitation and the low-power high-frequency signal excitation in the form of balanced polyphase currents is shown in FIG. 5.

The signal frequency current command signal $i^{s*}_{qdsi}$ is summed at a junction 93 with the fundamental current signal $i^{s*}_{qds1}$. The measured signal voltages $v^s_{qdsi}$ (rather than currents) are heterodyned and drive the tracking filter to obtain flux vector position and velocity estimates. A bandpass filter 94 can be used to isolate the signal voltage components $v^s_{qdsi}$ from the fundamental excitation and inverter switching harmonics. The controllers discussed below with respect to FIGS. 7 and 8 can be utilized with the system of FIG. 5 by substituting $v^s_{qsi}$ and $v^s_{dsi}$ for $i^s_{qsi}$ and $i^s_{dsi}$, respectively, and vice versa.

Figure 6:
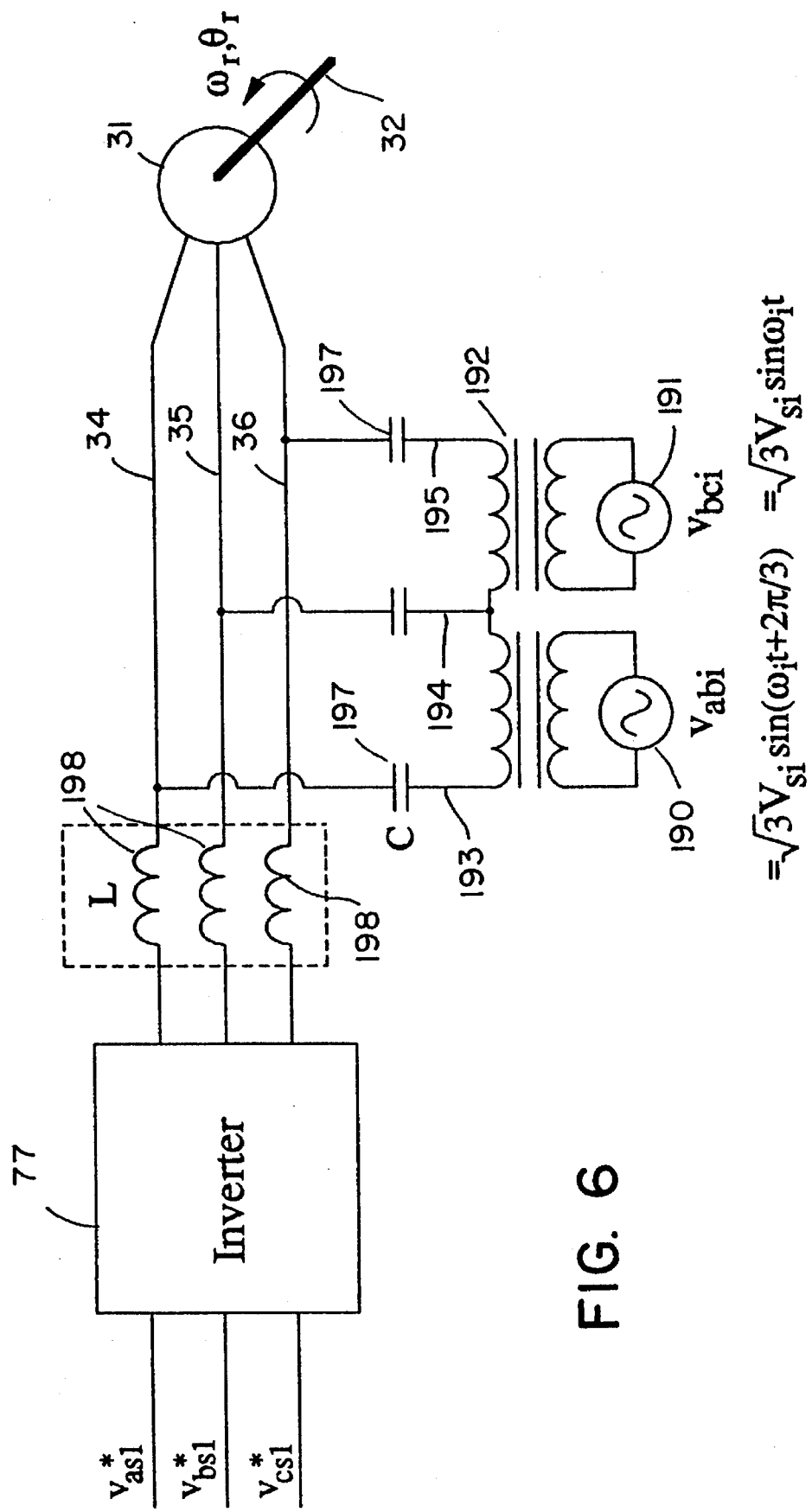
FIG. 6 is a schematic diagram of an implementation of the invention using low power signal injection external to the inverter.

In some systems, especially with large motors, generation of a balanced polyphase high-frequency voltage or current signal via the inverter may not be feasible. As an alternative signal injection scheme, FIG. 6 shows an implementation of the invention in which the high frequency voltage signal is injected into the output supply lines 34, 35 and 36 external to the inverter 77. In this implementation, the inverter 77 receives command signals $v^*_{as1}$, $v^*_{bs1}$ and $v^*_{cs1}$ (in three-phase machine frame coordinates) to cause the inverter to provide output power on the output supply lines 34, 35 and 36 at the fundamental frequency only. High frequency signal generators 190 and 191 of standard design (which may be a single generator with phase shifters), provide the high-frequency low power sine wave signals $v_{abi}=\sqrt{3}\,V_{si}\sin(\omega_i t+2\pi/3)$ and $v_{bci}=\sqrt{3}\,V_{si}\sin\omega_i t$ respectively. Note these signals correspond to the quadrature signals in two-phase q and d-axis coordinates, as depicted in the following FIGS. 7 and 8. The outputs of the signal generators 190 and 191 are provided to a transformer 192 which isolates the low and high power circuitry. Output lines 193, 194, and 195 are connected between the secondary of the transformer 192 and the output supply lines 34, 35 and 36. Capacitors 197 connected in the lines 193–195 provide high frequency coupling while blocking low frequencies back toward the signal generators 190 and 191. Inductors 198 connected in the lines 34, 35 and 36 between the inverter 77 and the connections of the lines 193–195 provide a high impedance to the high frequency signals from the signal generators 190 and 191 looking toward the inverter (relative to the stator impedance). The inductors 198 thus block high-frequency signal currents from flowing back into the inverter 77 and corrupting the estimation accuracy.

A preferred closed-loop heterodyne demodulation technique can be utilized to extract the flux vector position information from the stator currents (or voltages, as discussed) with high reliability and low noise. In the system of the present invention, multiplication of the q-axis and d-axis currents $i_{qsi}^s$ and $i_{dsi}^s$ from the coordinate transform circuit 46 by quadrature sinusoidal functions of estimated flux vector position and signal frequency, e.g., $\cos(2\hat{\theta}_e-\omega_i t)$ and $\sin(2\hat{\theta}_e-\omega_i t)$, respectively (where $\hat{\theta}_e$ is the estimated flux vector position in electrical radians and $\omega_i$ is the commanded signal frequency), results in a mixed signal $\epsilon$ given in Equation 1 below. The first term in Equation 1 is at frequency $2(\omega_i-\hat{\omega}_e)$ (assuming $\hat{\theta}_e=\hat{\omega}_e t$) and contains no useful position information. The second term, however, contains the desirable position information and approaches dc (and zero) as $\hat{\theta}_e \to \theta_e$.

$$\epsilon = i_{qsi}^s \cos(2\hat{\theta}_e - \omega_i t) - i_{dsi}^s \sin(2\hat{\theta}_e - \omega_i t) \quad (1)$$
$$= I_{i0}\sin[2(\omega_i t - \hat{\theta}_e)] + I_{i1}\sin[2(\theta_e - \hat{\theta}_e)]$$

Because $\hat{\omega}_e \ll \omega_i$ for normal operating conditions and injected signal frequencies, the first term can be easily removed via low pass filtering. The remaining heterodyned and filtered signal is essentially in the form of a linear position error $\epsilon_f$, i.e., $$\epsilon_f = I_{i1}\sin[2(\theta_e-\hat{\theta}_e)] \approx 2I_{i1}(\theta_e-\hat{\theta}+ee_e)\text{ as}\hat{\theta}_e \to \theta_e \quad (2)$$

Figure 7:
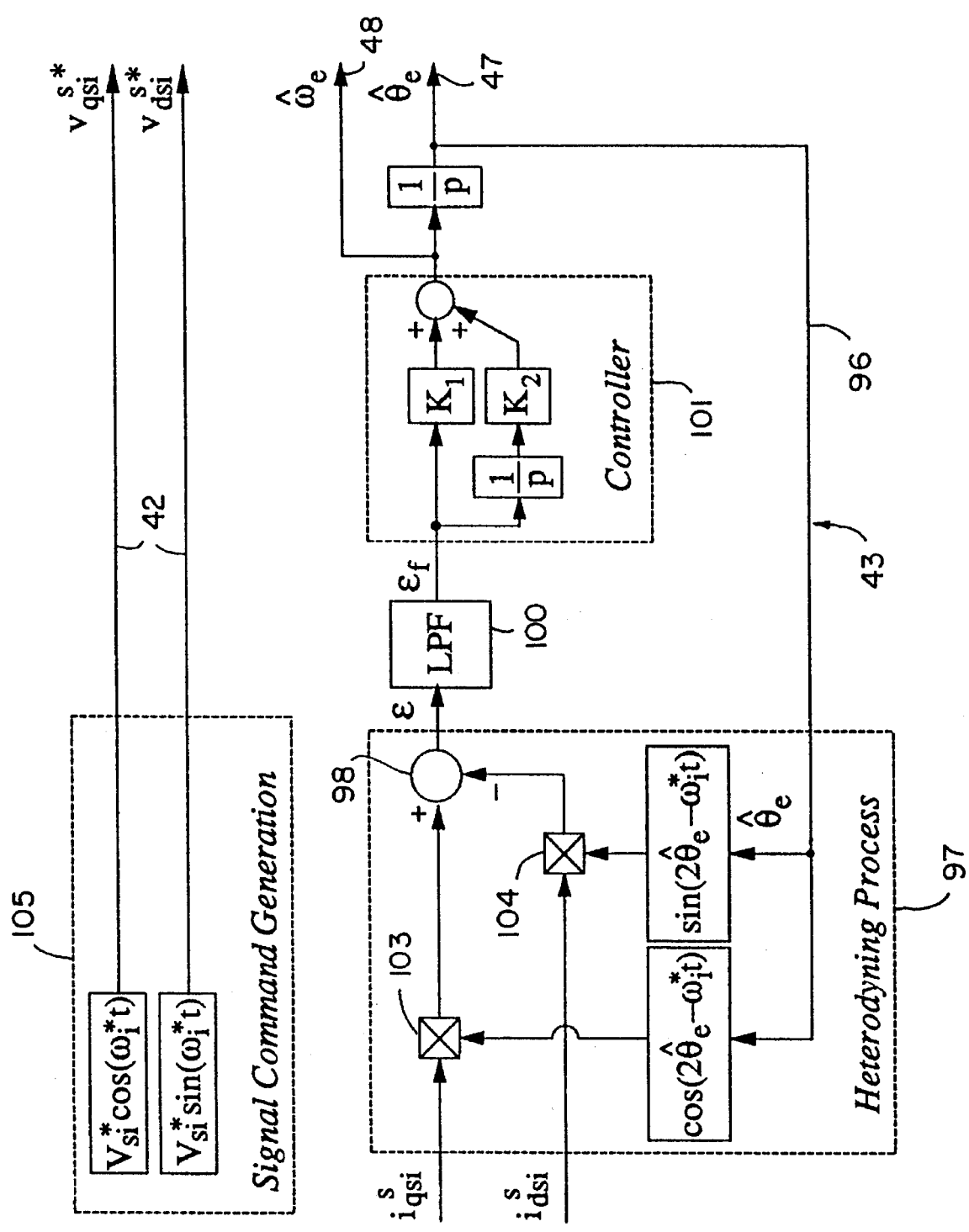
FIG. 7 is a schematic diagram of a tracking filter in accordance with the invention.

The position error signal $\epsilon_f$ can be used as a corrective error input to a tracking filter, as shown in FIG. 7 which is a block diagram of an implementation of the tracking filter 43. The position estimate $\hat{\theta}_e$ is provided on a path 96 to the heterodyne process 97 which calculates the functions $\cos(2\hat{\theta}_e-\omega_i t)$ and $\sin(2\hat{\theta}_e-\omega_i t)$, multiplies these functions times the current signals $i^s_{qsi}$ and $i^s_{dsi}$, respectively, and performs the subtraction to obtain Equation 1 at a junction 98. The signal $\epsilon$ from the output of the junction 98 is passed through a low pass filter 100 (e.g., having a cut-off frequency substantially below twice the injected signal frequency $\omega_i$ but above the maximum anticipated flux vector angular velocity $\omega_e$). The output signal from the low pass filter 100, $\epsilon_f$, is passed to a linear controller 101 which provides a flux vector velocity estimate on line 48, and via an integrator, a flux vector position estimate on line 47. The linear controller 101, consisting of gains $K_1$ and $K_2$ (with signal integration), forces convergence of the estimated flux vector position $\hat{\theta}_e$ on the actual position, i.e., $\hat{\theta}_e \to \theta_e$.

The low pass filter 100 may not be required in appropriate cases because the tracking filter controller may also act as a low pass filter. Alternative controllers are known and may also be used.

An important feature of the invention is that the accuracy of the position and velocity estimates is independent of the inductance magnitudes, at least to a first approximation. As seen from Equation (2), the coefficient $I_{i1}$, which contains the inductance terms, acts as a gain in the tracking filter. It does not affect the value to which the tracking filter estimates converge. It is also noted that a zero sequence component in the voltage or current, and thus a machine neutral connection, is not required.

Some fluctuation or unbalance of the voltage source driving the motor windings can be expected even with a voltage source inverter. The amount of voltage signal fluctuation and/or unbalance is dependent upon many factors. One source of fluctuation is a variation in the DC bus voltage due to a change in the motor operating point. For example, when the motor decelerates, kinetic energy is typically absorbed by the bus capacitors, causing the bus voltage to rise. Dissipation of the energy through resistors or conversion back to the AC supply is recommended to minimize the bus voltage fluctuations.

Inverter deadtime due to the rise and fall times of the switching devices and the intentionally introduced delay between the commutation of devices (to avoid accidental bus shoot throughs or short circuits), is another major cause of voltage signal fluctuation and unbalance. The implementation of schemes to minimize or compensate for deadtime are preferred.

The heterodyning process illustrated in FIG. 7 can be modified as discussed above to reduce the sensitivity to signal voltage unbalances and fluctuations. If the signal voltages are simply unbalanced such that the amplitudes are not equal, i.e. $V^s_{qsi} \neq V^s_{dsi}$, inclusion of the measured signal voltage amplitudes in the heterodyning process can reduce the estimation errors attributable to the unbalance. The modified heterodyning process is then of the form $$\epsilon = i_{qsi}^s V_{dsi}\cos(2\hat{\theta}_e-\omega_i t) - i_{dsi}^s V_{qsi}\sin(2\hat{\theta}_e-\omega_i t) \quad (3)$$

Some sensitivity to voltage fluctuations can also be reduced by normalizing the heterodyned signal with respect to the squared average of the signal amplitudes, i.e.

$$\epsilon = \frac{i_{qsi}^s V_{dsi}^s}{V_{sio}^{s2}} \cos(2\hat{\theta}_e - \omega_i t) - \frac{i_{dsi}^s V_{qsi}^s}{V_{sio}^{s2}} \sin(2\hat{\theta}_e - \omega_i t) \quad (4)$$

where $$V_{sio}^s = \frac{V_{qsi}^s + V_{dsi}^s}{2}$$

A signal regulation technique as depicted in FIG. 4 is, however, a preferred method of correcting for potential voltage unbalances and fluctuations due to nonideal signal generators.

The heterodyning process can also be performed in multiple steps involving sin/cos $(2\hat{\theta}_e)$ and sin/cos $(\omega_i t)$, since $$\sin(2\hat{\theta}_e - \omega_i t) = \sin(2\hat{\theta}_e) \cos(\omega_i t) - \cos(2\hat{\theta}_e) \sin(\omega_i t) \quad (5)$$

$$\cos(2\hat{\theta}_e - \omega_i t) = \cos(2\hat{\theta}_e) \cos(\omega_i t) + \sin(2\hat{\theta}_e) \sin(\omega_i t) \quad (6)$$

In general, in addition to the signal frequency components, the stator currents will also contain components at the fundamental drive frequency and harmonics of the power electronic switching frequency (for a PWM inverter).

Heterodyning all of these components as in Equation (1) will shift them by approximately plus or minus $\omega_i$ in the frequency domain. Provided that there is sufficient spectral spread between the signal frequency and the fundamental and inverter harmonics, e.g. $\omega_i \gg \omega_e$ and $\omega_i \ll \omega_h$, the desired position variant term $I_{i1} \sin[2(\theta_e - \hat{\theta}_e)]$ can still be easily extracted via appropriate filtering. Thus, the additional stator current components can be removed by some filtering either prior to or after heterodyning. Because the fundamental component will, in general, be much larger than the signal component, filtering prior to heterodyning is preferred to allow signal amplification to desired levels.

Note that heterodyning is mathematically equivalent to a coordinate transformation. The heterodyning can operate or occur in any desired reference frame, although the 2-phase d-q reference frame is generally desirable for conceptual reasons. With the applied signal voltages in 2-phase quantities being $$v_{qsi} = V_{si} \cos \omega_i t$$

$$v_{dsi} = -V_{si} \sin(\omega_i t),$$

the actual applied signal voltages in 3-phase (machine frame) quantities are:

$$v_{asi} = V_{si} \cos \omega_i t$$

$$v_{bsi} = V_{si} \cos(\omega_i t - 2\pi/3)$$

$$v_{csi} = V_{si} \cos(\omega_i t + 2\pi/3)$$

The resulting 3-phase stator signal currents (assuming the reactance dominates the stator impedance) are:

$$i_{asi} = I_{i0} \sin \omega_i t + I_{i1} \sin(2\theta_e - \omega_i t)$$

$$i_{bsi} = I_{i0} \sin(\omega_i t - 2\pi/3) + I_{i1} \sin(2\theta_e - \omega_i t - 2\pi/3)$$

$$i_{csi} = I_{i0} \sin(\omega_i t + 2\pi/3) + I_{i1} \sin(2\theta_e - \omega_i t + 2\pi/3)$$

Heterodyning the measured 3-phase currents in the form:

$$\epsilon = 2/3[i_{asi} \cos(2\hat{\theta}_e - \omega_i t) + i_{bsi} \cos(2\hat{\theta}_e - \omega_i t - 2\pi/3) + i_{csi} \cos(2\hat{\theta}_e - \omega_i t + 2\pi/3)] \quad (7)$$

yields the desired error term:

$$\epsilon = I_{i0} \sin(2\hat{\theta}_e - 2\omega_i t) + I_{i1} \sin(2(\theta_e - \hat{\theta}_e)) \quad (8)$$

If a neutral connection is absent, as is typical, then $$i_{as} + i_{bs} + i_{cs} = 0$$

In this case, $i_{cs}$, is often not measured, and is calculated if needed from $$i_{cs} = -i_{as} - i_{bs}$$

The heterodyning can then be simplified to $$\epsilon = 2/\sqrt{3} \; [i_{asi} \sin(2\hat{\theta}_e - \omega_i t + \pi/3) + i_{bsi} \cos(2\hat{\theta}_e - \omega_i t)] \quad (9)$$

Figure 8:
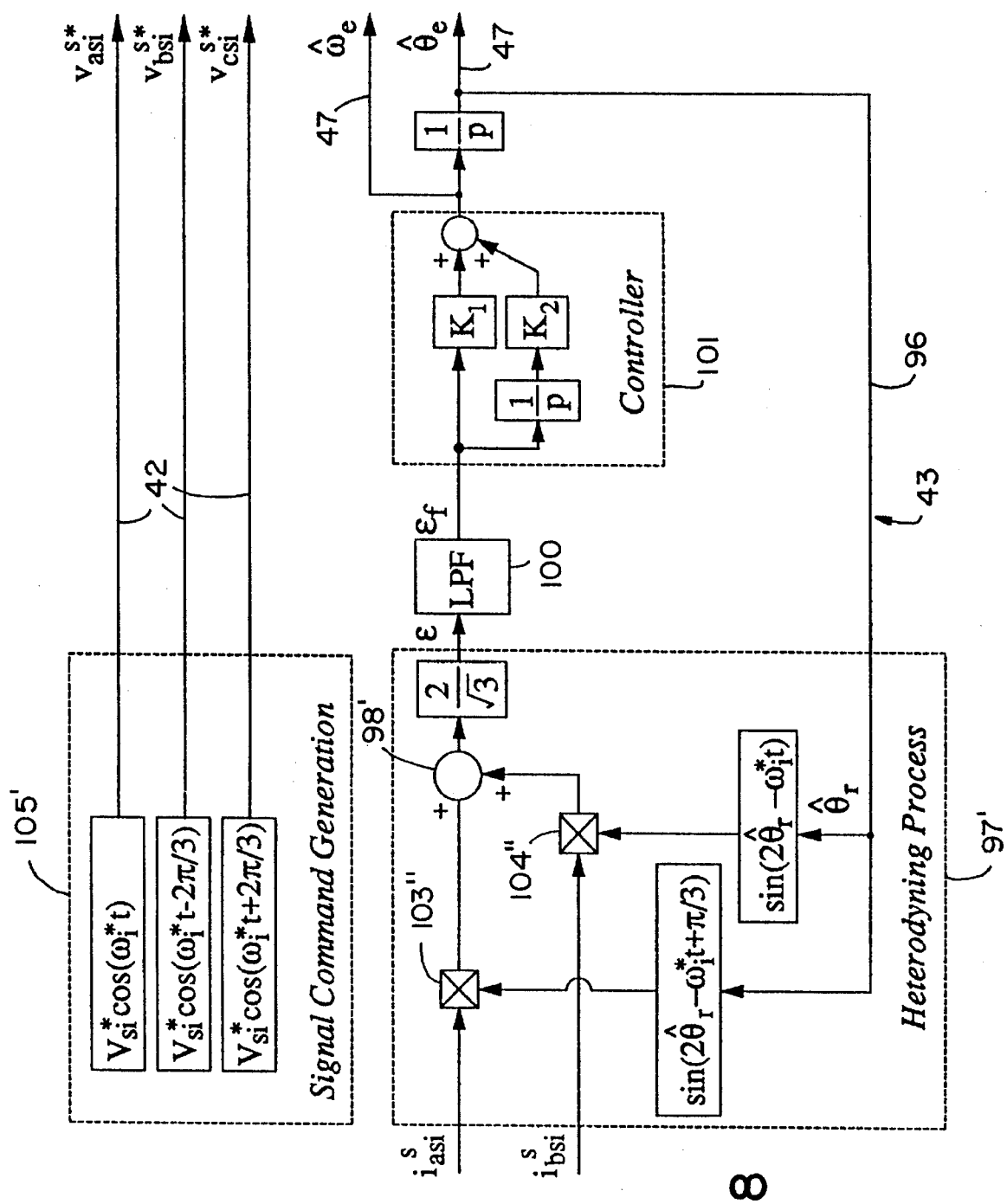
FIG. 8 is a schematic diagram of a tracking filter utilizing 3-phase quantities.

An implementation of a heterodyning demodulation scheme utilizing 3-phase machine-frame quantities, and assuming no neutral connection, i.e., $i_{as} + i_{bs} + i_{cs} = 0$, is shown in FIG. 8. The tracking filter of FIG. 8 is similar to that of FIG. 7, and includes a signal command generator which provides the three phase, high (signal) frequency command signals. The low pass filter 100 and observer controller 101 are the same as in FIG. 7. The heterodyning process 97' calculates the functions $\sin(2\hat{\theta} - \omega_i^* t + \pi/3)$ and $\sin(2\hat{\theta}_e - \omega_i^* t)$, multiplies these functions times the current signals $i_{asi}^s$ and $i_{bsi}^s$, respectively, performs the addition at a junction 98', and applies a factor $2/\sqrt{3}$ to provide the error signal $\epsilon$ in Equation (9).

As an alternative to the tracking filter approaches, the stator currents may be heterodyned with simply $\cos \omega_i t$ and $\sin \omega_i t$, yielding $$\begin{aligned}\epsilon &= i_{qsi}^s \cos \omega_i t + i_{dsi}^s \sin \omega_i t \\ &= I_{i0} \sin(2\omega_i t) + I_{i1} \sin(2\theta_e)\end{aligned} \quad (10)$$

After low pass filtering $$\epsilon_f = I_{i1} \sin(2\theta_e) \quad (11)$$

If $I_{i1}$ were known or accurately estimated then $$\hat{\theta}_e = \arcsin\left(\frac{\epsilon_f}{\hat{I}_{i1}}\right) \quad (12)$$

A lookup table (e.g., in EPROM) may be used to determine the arcsine. The major drawback of this approach is that the accuracy of the position estimate is directly dependent upon the accuracy of $\hat{I}_{i1}$. However, in lower performance drives, the accuracy may be sufficient.

As another alternative, the squared magnitude of the measured signal currents can be used yielding $$\epsilon = i_{qsi}^{s2} + i_{qsi}^{s2} = I_{i0}^2 + I_{i1}^2 + 2 I_{i0} I_{i1} \cos(2\theta_e - 2\omega_i t) \quad (13)$$

After high pass filtering $$\epsilon_f = 2 I_{i0} I_{i1} \cos(2\theta_e - 2\omega_i t) \quad (14)$$

A phase detector/comparator can then be used to obtain the phase shift relative to the known signal $\cos 2\omega_i t$, and thus obtain the flux vector position. Timing of the respective zero crossings is one method of phase detection. One major drawback of such an approach is the high sensitivity of the zero crossing to noise and harmonics in the signals.

As depicted in FIGS. 4–6, the injected signal can be generated via either additional dedicated circuitry or via the power electronic inverter already producing the fundamental drive frequency power. The power electronic inverter is the preferred generator based upon cost (and, generally, reliability) considerations. Modern hard-switched power electronic inverters are approaching and even exceeding switching frequencies of 20 kHz for small to medium size drives (<50 kw). Switching frequencies of 20 kHz or greater are desirable to reduce acoustic noise and to obtain high current regulation bandwidth. Soft-switched inverters such as the resonant dc link converter operate at considerably higher switching frequencies.

A balanced polyphase 1 to 2 kHz signal with low harmonic distortion can be readily synthesized in addition to the fundamental excitation when using 5 kHz to 20 kHz switching, in the manner as described above and illustrated in FIGS. 4 and 5. Preferably, the inverter switching frequency should be at least 5 to 10 times the signal frequency. Further, the signal frequency should be at least 5 to 10 times the highest fundamental frequency of drive power provided to the motor.

In larger drive systems (>100 kW), inverter switching frequencies of <1–2 kHz are common. If the system is to be operated up to frequencies of 60 Hz or higher, synthesis of a sufficiently high signal frequency via the inverter may not be possible. In such cases, additional dedicated circuitry (as depicted in FIG. 6) may be desirable to generate the signals at frequencies sufficiently higher than the inverter switching, e.g., >5–10 kHz.

Alternatively, flux estimation could be achieved via well established methods based upon the integration of the stator fundamental voltage at high speeds, while utilizing the present invention to determine flux vector position only at zero and low speeds. In this case, signal injection in accordance with the present invention would only be used at low fundamental frequencies. A signal frequency of 50–250 Hz would be sufficiently high under such conditions and could be generated by larger inverters. Since intentional operation at high flux levels to create saturation-induced saliencies is generally not desirable or even possible at higher speeds due to increased losses and voltage limits, this latter approach is a preferred method.

Synthesis of the polyphase signal voltage by a pulse width modulated (PWM) voltage source inverter (VSI) will reduce the maximum amplitude of the fundamental component that can be generated by the same inverter. The common practices of pulse dropping and ultimately conversion from a PWM to a 6-step switching scheme, to increase the fundamental component, will not permit the simultaneous synthesis of the signal component. Therefore, unless the DC bus voltage is raised, field weakened operation of the motor may be required at a lower speed. To minimize this voltage derating, the detection circuitry is preferably designed such that the signal voltage and current amplitudes are as small as possible.

The above-described motor drive systems may be implemented utilizing conventional hardware components and circuit designs. Exemplary circuit implementations are described below, but it is understood that these are for purposes of illustration only, and the present invention may utilize any implementation that will carry out the essential functions of the invention.

Figure 9:
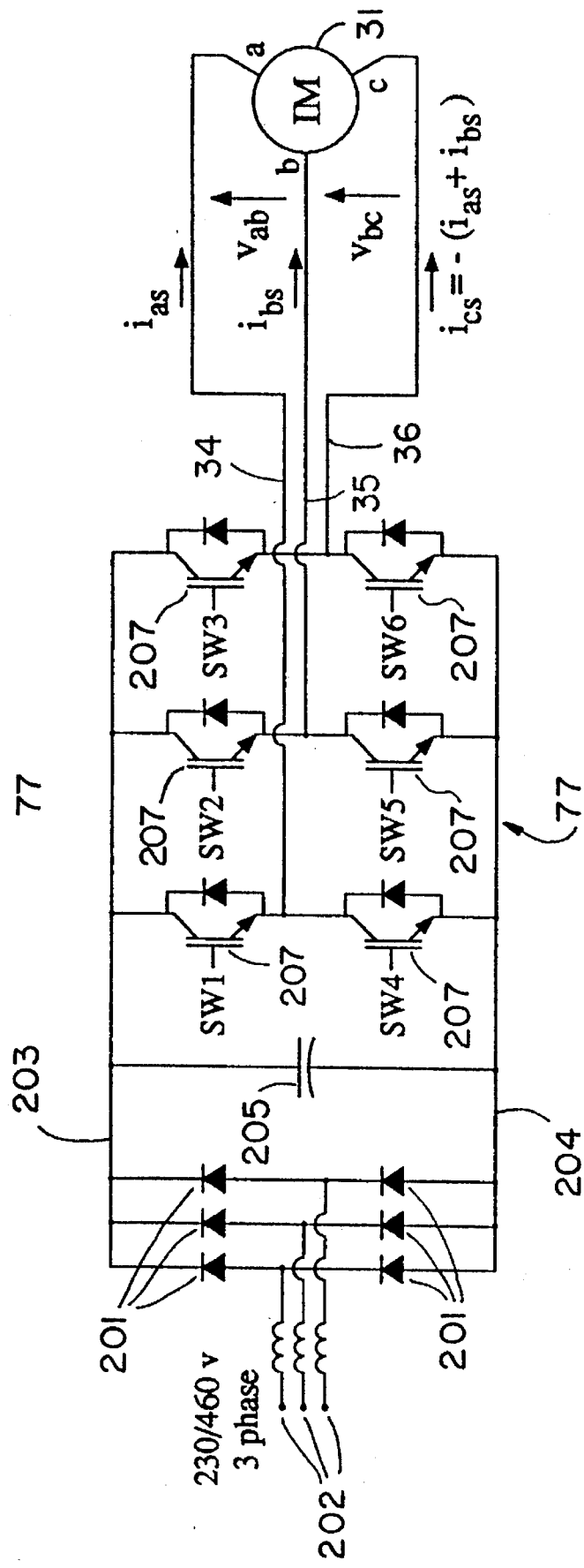
FIG. 9 is a schematic circuit diagram of an exemplary three-phase inverter which may be utilized in the AC machine drive system of the invention.

An exemplary 3-phase inverter topology which may be utilized as the inverter 77 is shown in FIG. 9. The inverter of FIG. 9 utilizes a diode bridge, formed of diodes 201, to rectify the (typically 3-phase) commercial power from power lines 202 to provide DC voltage on DC bus lines 203 and 204, across which an energy storage and filtering capacitor 205 is connected. The DC voltage on the lines 203 and 204 is inverted to 3-phase output voltage on lines 34, 35 and 36 by a 3-phase inverter composed of (e.g.) insulated gate bipolar transistor (IGBT) switching devices 207 connected in a bridge configuration. The switching of the devices 207 is controlled by switching signals provided to the gates of the devices in a conventional manner.

Figure 10:
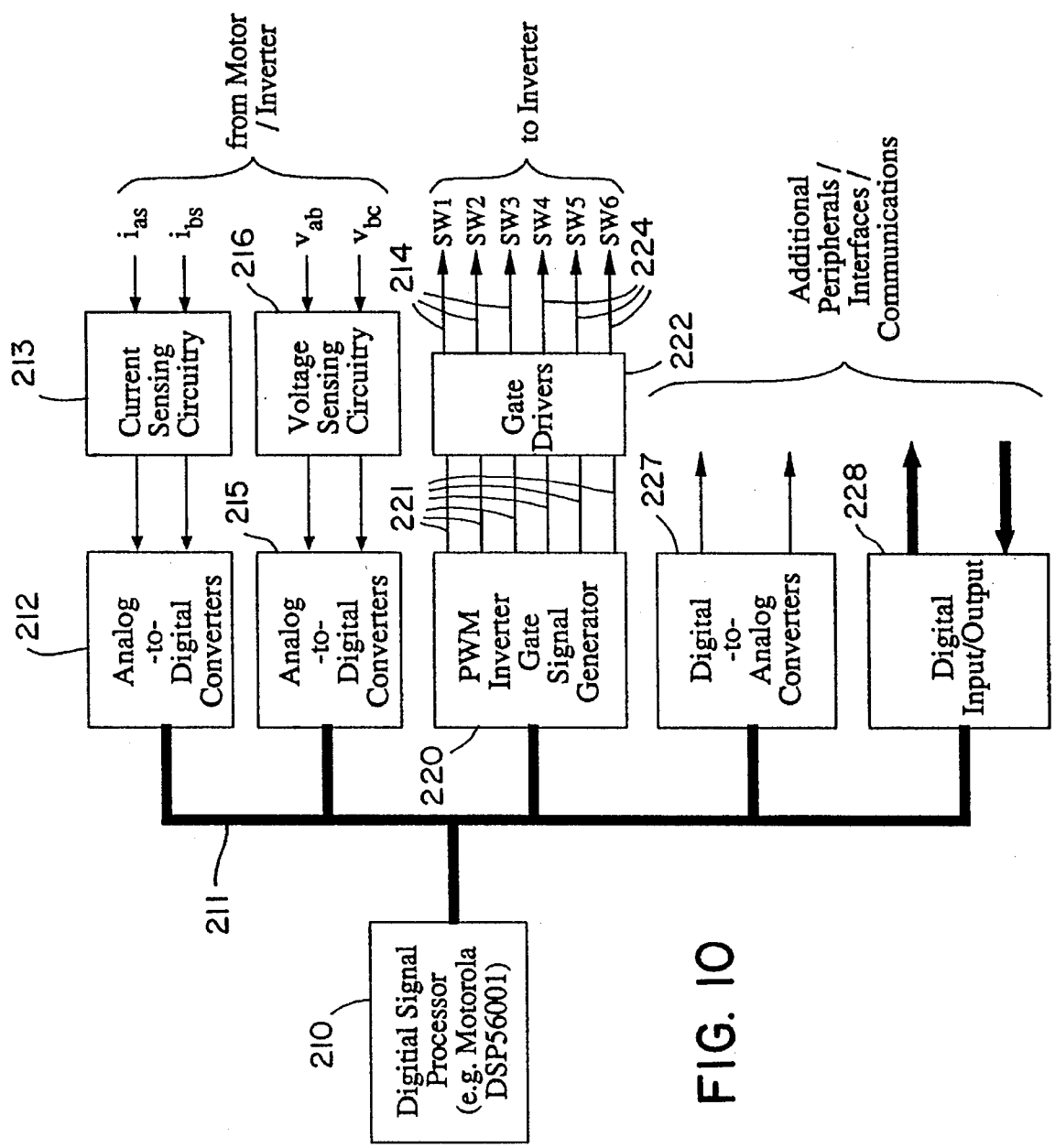
FIG. 10 is a block diagram of a digital signal processor implementation that may be utilized in the AC machine drive system of the invention.

An exemplary system for providing the switching signals to the switches 207 of the inverter of FIG. 9 is shown in FIG. 10. The system of FIG. 10 may be used to provide a digital signal processor based implementation of the drive system of FIG. 1, utilizing the processing of, e.g., FIGS. 4 or 5 and FIGS. 7 or 8. The system of FIG. 10 includes a digital signal processor (DSP) 210, e.g., a Motorola DSP56001, which is connected by data bus and control lines 211 in a conventional manner to analog-to-digital converters 212 which receive current signals from current sensing circuitry 213, and to analog-to-digital converters 215 which receive voltage signals from voltage sensing circuitry 216, thereby to provide the DSP 210 with data indicative of the current signals $i_{as}$ and $i_{bs}$ and the voltage signals $v_{ab}$ and $v_{bc}$. The DSP 210 provides control and data signals to a PWM inverter gate signal generator 220 which provides output signals on lines 221 to gate drivers 222 which, in turn provide the necessary switching signals on lines 224 to the gates of the switching devices 207. Additional digital to analog converters 227 and digital input and output interfaces and communications ports 228 are in communication with the DSP 210 in a conventional manner. The DSP 210 may be programmed in a conventional and well-known manner to carry out the signal processing of the implementation of FIG. 1, or any other motor control implementation, or to simply provide flux vector position and/or velocity information.

Figure 11:
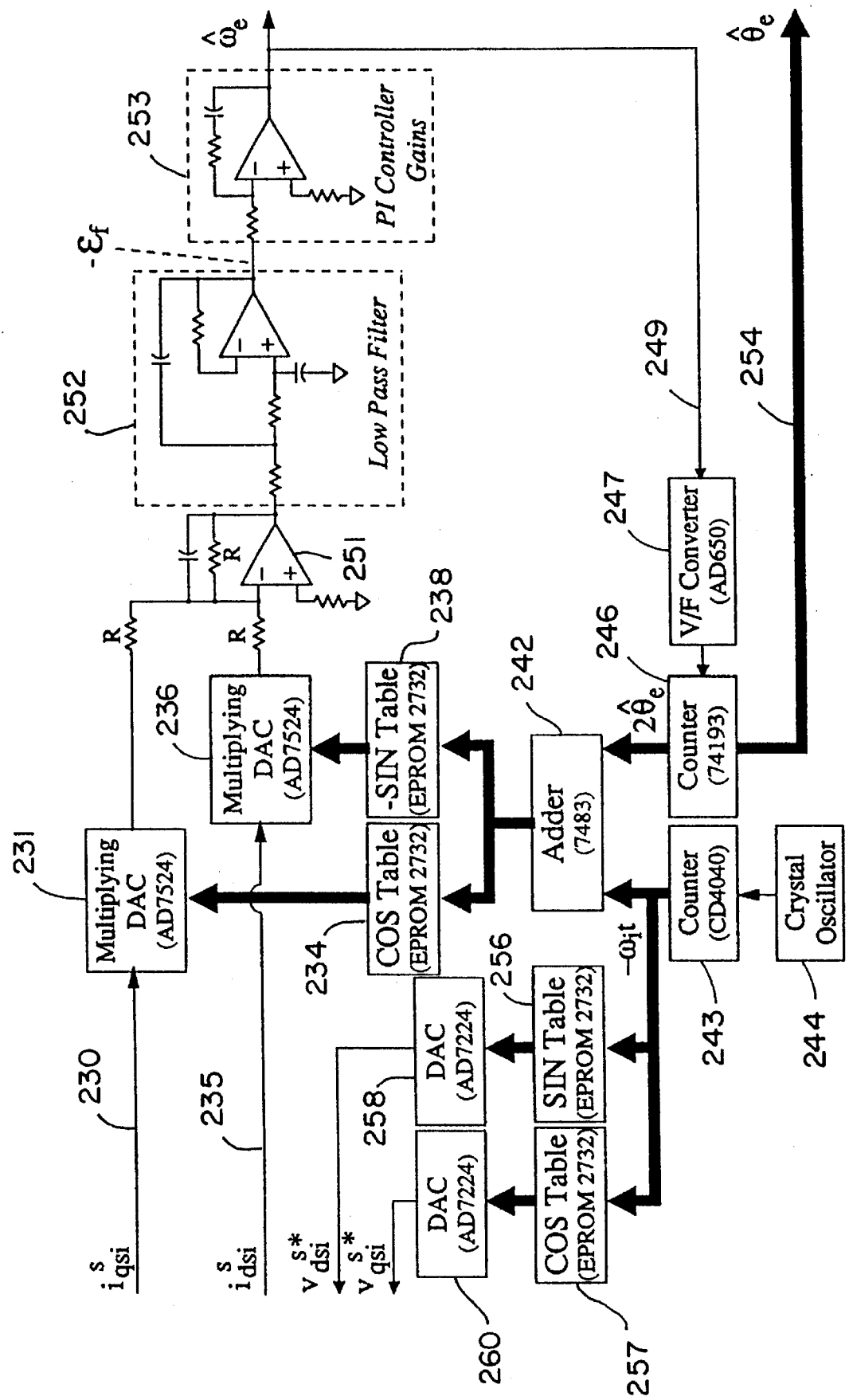
FIG. 11 is a circuit diagram of an exemplary hybrid digital/analog implementation of a tracking filter in accordance with the invention.

As an alternative to the fully digital implementation of FIG. 10, the tracking filter 43 of the invention may be implemented by a hybrid digital/analog circuit as illustrated in FIG. 11. The illustrative implementation of FIG. 11 includes the heterodyning process, a linear state feedback controller, and signal command generation for the tracking filter depicted in FIG. 7. Exemplary integrated circuits which may be used in this implementation are indicated in parenthesis on the units shown in the drawings. An analog signal from the filter and coordinate transform circuit 46, indicative of the current $i_{qsi}^s$, is brought in on a line 230 to a multiplying digital-to-analog converter (DAC) 231. The digital input of the DAC 231 is provided from a cosine table in an EPROM 234. Similarly, an analog signal from the circuit 46, indicative of the signal $i_{dsi}^s$, is brought in on a line 235 to a multiplying DAC 236 which receives its digital input from an EPROM 238 which is programmed with a minus sine table. The EPROMS 234 and 238 are driven by an adder 242 which receives inputs from a counter 243 driven by a crystal oscillator 244, and from a counter 246 driven by a voltage to frequency converter 247. The voltage to frequency converter 247 is driven by a signal on a line 249 which is indicative of the estimated flux angular velocity $\omega_e$. The outputs of the DACs 231 and 236 are summed in a summing and filter amplifier 251 to provide an error signal $\epsilon$ which is passed through a low pass filter section 252 (acting as low pass filter 100) to provide error signal $-\epsilon_f$. The filtered error signal then passes through a section 253 incorporating the linear controller 101 to provide the estimated velocity signal $\hat{\omega}_e$. The converter 247 and counter 246 effectively act as a digital integrator of $\hat{\omega}_e$. The output of the counter 246 on lines 254 is data corresponding to the flux vector angular position estimate $\hat{\theta}_e$. The output of the counter 243, in addition to being provided to the adder 242, is also provided to an EPROM 256, programmed with a sine table, and an EPROM 257, programmed with a cosine table. The output of the EPROM 256 is provided to a DAC 258 which provides an analog output signal indicative of $v_{dsi}^{s*}$, and the output of the EPROM 257 is provided to a DAC 260, the analog output of which is the signal $v_{qsi}^{s*}$.

The filter and coordinate transform circuit 46 may be implemented in standard ways. An exemplary circuit providing stator sensing, 3 to 2 phase transformation, and isolation of signal and fundamental current components via first order high- and low-pass filtering is shown in FIG. 12. The equations for the coordinate transformations implemented by the circuit of FIG. 12 are well known. For three phase supply without a neutral connection, $i_{as}+i_{bs}+i_{cs}=0$, and $$i_{qs}^s = \frac{2}{3}\left[i_{as}^s - \frac{1}{2}(i_{bs}^s + i_{cs}^s)\right] = i_{as}^s \qquad (15)$$

$$i_{ds}^s = -\frac{1}{\sqrt{3}}(i_{bs}^s - i_{cs}^s) = -\frac{1}{\sqrt{3}}(i_{as}^s + 2i_{bs}^s) \qquad (16)$$

The phase "a" stator current is sensed by, e.g., a Hall-effect current sensor acting as the sensor 39, which provides an output signal on a line 266 indicative of $i_{as}$, which is defined equal to $i_{qs}^2$, and the signal is passed through a low-pass output filter circuit 267 to provide the signal $i_{qs1}^s$, and through a high-pass filter 268 to provide the signal $i_{qsi}^s$. Similarly, the phase "b" stator current is detected by a Hall-effect sensor 39 which provides an output signal on a line 271, indicative of $i_{bs}$, which is passed through a summing amplifier 272 where it is appropriately summed with the signal $i_{as}$ to provide the signal $i_{ds}^s$ on a line 273. The signal on the line 273 is provided to a low-pass filter 274 to provide the signal $i_{ds1}^2$, and to a high-pass filter 275 to provide the signal $i_{dsi}^s$. The signals $i^s{}_{dsi}$ and $i^s{}_{qsi}$ will also contain higher harmonics at the inverter switching frequency, but these are generally of low amplitude and can be filtered out within the tracking filter.

A similar circuit can be used to provide the voltages $v_{qs1}^s$, $v_{ds1}^s$, and $v_{qsi}^s$ and $v_{dsi}^s$. All computations and transformations are based on a per phase wye connection line-to-neutral basis. Thus, all transformations used within the invention are independent of whether the motor is delta or wye connected. The voltages measured across lines 34, 35, and 36 are line-line voltages $v_{ab}^s$ and $v_{bc}^s$ (and thus also $v_{ca}^s$), where $v_{ab}^s=v_{as}^s-v_{bs}^s$, etc. Transformation to 2 phase quantities is simply $$\begin{aligned}v_{qs}^s &= \frac{2}{3}\left(v_{as}^s - \frac{1}{2}(v_{bs}^s + v_{cs}^s)\right) \\ &= \frac{2}{3}\left((v_{as}^s - v_{bs}^s) + \frac{1}{2}(v_{bs}^s - v_{cs}^s)\right) \\ &= \frac{2}{3}v_{ab}^s + \frac{1}{3}v_{bs}^s\end{aligned} \qquad (17)$$

$$\begin{aligned}v_{ds}^s &= -\frac{1}{\sqrt{3}}(v_{bs}^s - v_{cs}^s) \\ &= -\frac{1}{\sqrt{3}}v_{bs}^s\end{aligned} \qquad (18)$$

Figure 13:
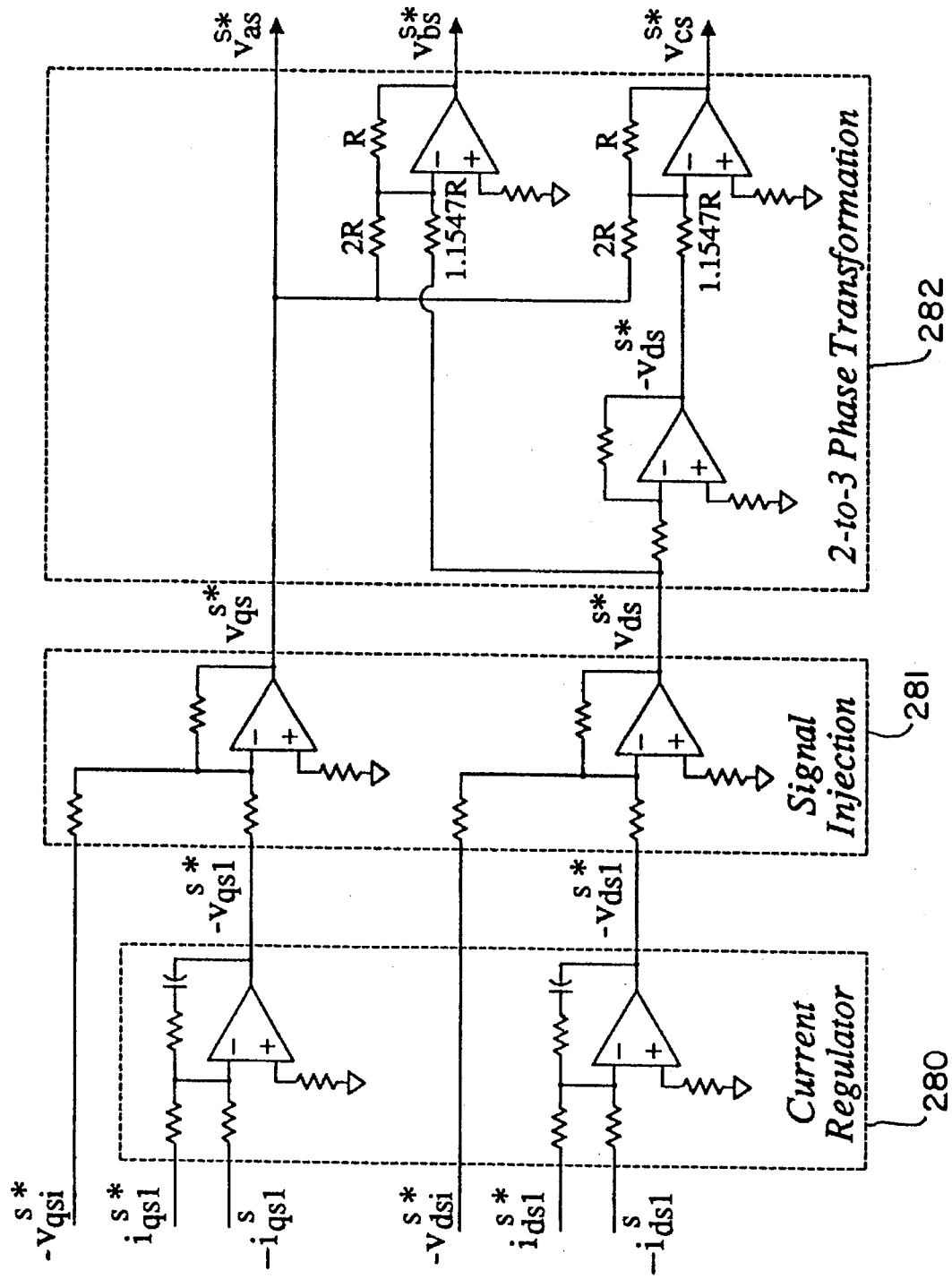
FIG. 13 is a schematic circuit diagram of an exemplary analog circuit which generates voltage references for a pulse width, pulse density, or space vector modulated voltage source inverter.

An exemplary analog circuit that can be utilized to generate voltage references to be provided to a pulse-width-modulation (PWM) voltage source inverter is illustrated in FIG. 13. The circuit of FIG. 13 includes a current regulator 280 which receives the input signals as shown and provides output signals $-v_{qs1}^{s*}$ and $-v_{ds1}^{s*}$. These signals and the injected frequency signals $-v_{qsi}^{s*}$ and $-v^{s*}{}_{dsi}$ are provided to a signal injection circuit 281 which generates the signals $v_{qs}^{s*}$ and $v_{ds}^{s*}$. These output signals are provided to a 2-phase to 3-phase transformation circuit 282 which generates the voltage references $v_{as}^{s*}$, $v_{bs}^{s*}$, and $v_{cs}^{s*}$. Without a zero sequence component; i.e., $v_{0s}^{s*}=0$, then $v_{as}^{s*}+v_{bs}^{s*}+v_{cs}^{s*}=0$, and $$v_{as}^{s*} = v_{qs}^{s*} \qquad (19)$$

$$v_{bs}^{s*} = -\frac{1}{2}(v_{qs}^{s*} + \sqrt{3}\, v_{ds}^{s*}) \qquad (20)$$

$$v_{cs}^{s*} = -\frac{1}{2}(v_{qs}^{s*} - \sqrt{3}\, v_{ds}^{s*}) \qquad (21)$$

The reference voltages generated in FIG. 13 are phase voltages for a Y (wye) equivalent system. The inverter will generate line-line voltages based on these phase voltage references; e.g., $v_{ab}^s=v_{as}^{s*}-v_{bs}^{s*}$, independent of whether the motor is delta or wye connected. The current regulator 280 is a stationary frame proportional and integral linear controller which is simple to implement and has adequate performance for many applications. If higher performance is required, improved current regulators such as the synchronous frame proportional and integral controller may be utilized.

For convenience, the following is a listing of the nomenclature and abbreviations which have been used herein.

| | |
|---|---|
| BPF | band pass filter |
| HPF | high pass filter |
| LPF | low pass filter |
| PWM | pulse width modulated (inverters) |
| VSI | voltage source inverter |
| ˆ | superscript denoting estimated quantities. |
| * | superscript denoting commanded or reference quantities |
| e | superscript denoting a synchronous frame quantity |
| s | superscript denoting a stationary frame quantity |
| $I_{i0}$ | amplitude of the undesirable component in the heterodyned signal, $\epsilon$, i.e. for an induction motor system |

$$I_{i0} \approx \frac{V_{si}}{\omega_i}\; \frac{\sigma L_s}{\sigma L_s^2 - \Delta \sigma L_s^2}$$

with the stator transient inductance dominating the impedance at the signal frequency $I_{i1}$ — amplitude of the component in the heterodyned signal, $\epsilon$, containing the desirable position information; i.e. for an induction motor system $$I_{i1} \approx \frac{V_{si}}{\omega_i}\; \frac{\Delta \sigma L_s}{\sigma L_s^2 - \Delta \sigma L_s^2}$$

with the stator transient inductance dominating the impedance at the signal frequency

| | |
|---|---|
| $i_{as}, i_{bs}, i_{cs}$ | measured three phase stator currents. |
| $i^{s*}{}_{qds}$ | commanded stator current vector in the stationary frame; i.e. $i^{s*}{}_{qds} = [i^{s*}{}_{qs}, i^{s*}{}_{ds}]$ |
| $i^s{}_{qds}$ | measured/actual stator current voltage vector in the stationary frame; i.e. $i^s{}_{qds} = [i^s{}_{qs}, i^s{}_{ds}]$; includes fundamental and signal frequency components |
| $i^s{}_{qds1}$ | fundamental (driving frequency component of the measured stator current vector in two-phase stationary frame coordinates; i.e. $i^s{}_{qds1} = [i^s{}_{qs1}, i^s{}_{ds1}]$. |
| $i^s{}_{qdsi}$ | signal frequency component of the measured stator current vector in two-phase stationary frame coordinates; i.e. $i^s{}_{qdsi} = [i^s{}_{qsi}, i^s{}_{dsii}]$. |
| $K_1, K_2$ | state feedback gains of linear controller |
| $\Delta \sigma L_s$ | amplitude of the stator transient inductance modulation seen by the stator windings of an induction motor; i.e. |

$$\Delta \sigma L_s = \frac{\sigma L_{qs} - \sigma L_{ds}}{2} \qquad (22)$$

where $\sigma L_{qs}$ and $\sigma L_{ds}$ are the stator transient inductances seen along the stator q and d-axes, respectively.

$\sigma L_s$ — average stator transient inductance seen by the stator windings of an induction motor;

-continued $$\sigma L_s = \frac{\sigma L_{qs} + \sigma L_{ds}}{2} \quad (23)$$

| | |
|---|---|
| p | derivative operator with respect to time; p = d/dt |
| t | time |
| $v_{as}, v_{bs}, v_{cs}$ | measured three phase stator voltages |
| $v^s_{qds}$ | measured/actual stator voltage vector in two-phase stationary frame coordinates; i.e. $v^s_{qds} = [v^s_{qs}, v^s_{ds}]$, includes fundamental and signal frequency components. |
| $v^s_{qds1}$ | fundamental (driving) frequency component of the measured stator voltage vector in two-phase stationary frame coordinates; i.e. $v^s_{qds1} = [v^s_{qs1}, v^s_{ds1}]$ |
| $v^s_{qdsi}$ | signal frequency component of the measured stator voltage vector in two-phase stationary frame coordinates; i.e. $v^s_{qdsi} = [v^s_{qsi}, v^s_{dsi}]$ |
| $V^s_{dsi}$ | amplitude of the measured signal frequency d-axis voltage; $v^s_{dsi} = V^s_{dsi} \sin(\omega_i t)$ |
| $V^s_{qsi}$ | amplitude of the measured signal frequency q-axis voltage; $v^s_{qsi} = V^s_{qsi} \cos(\omega_i t)$ |
| $V^*_{si}$ | amplitude of the commanded signal frequency voltage; i.e. $v^{s*}_{qsi} = V^*_{si} \cos(\omega_i^* t)$ |
| $V_{si0}$ | average amplitude of the measured signal frequency voltages; $V_{si0} = (V^s_{dsi} + V^s_{qsi})/2$ |
| $\epsilon$ | error signal obtained after heterodyning |
| $\epsilon_f$ | error signal obtained after heterodyning and low pass filtering |
| $\theta_e$ | flux vector angular position (electrical radians) |
| $\omega_e$ | flux vector angular velocity (radians/sec.) |
| $\omega_h$ | frequency of harmonics, e.g. inverter switching frequencies (radians/second) |
| $\omega_i$ | signal frequency (radians/second) |

It is understood that the invention is not confined to the particular illustrative embodiments described herein, but embraces all such modified forms thereof as come within the scope of the following claims.

What is claimed is:

1. A motor drive system comprising:
   (a) an induction motor including a stator with a plurality of stator windings thereon, and a rotor mounted for rotation within the stator, the rotor being uniform such that the impedance as seen by the stator windings does not substantially vary as a function of the rotational position of the rotor;
   (b) drive means, connected to the stator windings, for providing AC drive power to the stator windings at a fundamental drive frequency of the motor which is at a level sufficient to provide magnetic saturation in the stator and for also providing power to the stator windings at a signal frequency which is substantially higher than the drive frequency; and
   (c) means for measuring the response of the stator windings to the signal frequency power to determine the variation of the response as a function of time during operation of the motor whereby the angular position or the speed of the magnetic flux vector or both can be determined.

2. The motor drive system of claim 1 wherein the rotor is a squirrel cage rotor having a rotor body with a plurality of conductive bars extending through the body at spaced positions around the periphery of the rotor wherein slots are formed in the rotor body above each bar so that the rotor has semi-closed slots of substantially uniform width.

3. The motor drive system of claim 1 wherein the drive means includes an inverter having a plurality of switching devices connected in a bridge configuration and control means for controlling the switching of the switching devices to provide AC power to the stator windings, wherein the control means controls the switching of the switching devices of the inverter in a pulse width modulated manner at a high switching frequency to provide pulse width modulated output power which includes a component at the fundamental drive frequency and a component at the high signal frequency.

4. The motor drive system of claim 1 wherein the means for measuring the response of the stator to signal frequency power includes a heterodyne demodulator mixing a signal which is a function of the high signal frequency with the response from the stator windings to provide a signal indicative of the rotational position of the magnetic flux vector.

5. The motor drive system of claim 1 wherein the induction motor is a three phase motor having three input lines, wherein the means for measuring includes means for detecting the currents in the input lines to the motor, means for transforming the detected currents to equivalent q-axis and d-axis current signals $i^s_{qsi}$ and $i^s_{dsi}$, respectively, means for heterodyning the current signals to provide a mixed signal $\epsilon$ which is a function in accordance with the expression:

$$\epsilon = i^s_{qsi} \cos(2\hat{\theta}_e - \omega_i t) - i^s_{dsi} \sin(2\hat{\theta}_e - \omega_i t),$$

where $\hat{\theta}_e$ is an existing estimate of the magnetic flux vector position and $\omega_i$ is the signal frequency, and including a low pass filter filtering the signal $\epsilon$ to provide a filtered signal $\epsilon_f$ which is a function in accordance with the expression $$\epsilon_f = I_{i1} \sin[2(\theta_e - \hat{\theta}_e)]$$

where $I_{i1}$ is a current amplitude and $\theta_e$ is the actual magnetic flux vector position.

6. The motor drive system of claim 5 wherein the measuring means further includes a tracking filter controller receiving the filtered signal $\epsilon_f$, the controller providing a selectively weighted and conditioned version of the signal $\epsilon_f$ which is used to provide output signals which are estimates of magnetic flux vector speed $\hat{\omega}_e$ and position $\hat{\theta}_e$, the position estimate $\hat{\theta}_e$ being fed back to the means for heterodyning to drive the signal $\epsilon_f$ toward zero.

7. The motor drive system of claim 1 wherein the drive means comprises an inverter connected to the stator windings to provide the AC drive power on supply lines to the stator windings at the fundamental frequency and signal generators coupled to the supply lines to provide power to the stator windings at the signal frequency.

8. The motor drive system of claim 1 wherein the motor is a three phase motor and the drive means provides balanced power at the drive frequency and the signal frequency to the three phase stator windings.

9. A motor drive for providing drive power to polyphase AC induction motors of the type which have a stator with stator windings and a uniform rotor comprising:
   (a) an inverter bridge adapted to receive power and having a plurality of switching devices which can be switched to provide polyphase AC power at output supply lines of the inverter;
   (b) control means for controlling the switching of the switching devices of the inverter to provide AC power at the output terminals of the inverter which can be provided to stator windings of an AC motor, wherein the control means controls the switching of the switching devices of the inverter to provide output power which includes a polyphase component at a fundamental drive frequency for a motor at a level sufficient to provide magnetic saturation in the stator and a balanced polyphase component at a substantially higher signal frequency; and (c) means for measuring the response of the stator windings at the output supply lines to the signal frequency power to determine the variation of the response as a function of time during operation of the motor whereby the angular position or the speed of the magnetic flux vector or both can be determined.

10. The motor drive of claim 9 wherein the means for measuring the response of the stator windings to the signal frequency power includes a heterodyne demodulator mixing a signal which is a function of the high signal frequency with the response from the stator windings to provide a signal indicative of the rotational position of the magnetic flux vector.

11. The motor drive of claim 9 wherein the inverter is a current regulated inverter.

12. The motor drive of claim 9 wherein the induction motor is a three phase motor having three input lines, wherein the means for measuring includes means for detecting the currents in the input lines to the motor, means for transforming the detected currents to equivalent q-axis and d-axis current signals $i^s_{qsi}$ and $i^s_{dsi}$, respectively, means for heterodyning the current signals to provide a mixed signal $\epsilon$ which is a function in accordance with the expression:

$$\epsilon = i_{qsi}^s \cos(2\hat{\theta}_e - \omega_i t) - i_{dsi}^s \sin(2\hat{\theta}_e - \omega_i t),$$

where $\hat{\theta}_e$ is an existing estimate of the magnetic flux vector position and $\omega_i$ is the signal frequency, and including a low pass filter filtering the signal $\epsilon$ to provide a filtered signal $\epsilon_f$ which is a function in accordance with the expression $$\epsilon_f = I_{i1} \sin[2(\theta_e - \hat{\theta}_e)]$$

where $I_{i1}$ is a current amplitude level and $\theta_e$ is the actual magnetic flux vector position.

13. The motor drive of claim 12 wherein the measuring means further includes a tracker filter controller receiving the filtered signal $\epsilon_f$, the controller providing a selectively weighted and conditioned version of the signal $\epsilon_f$ which is used to provide output signals which are estimates of magnetic flux vector speed $\hat{\omega}_e$ and position $\hat{\theta}_e$, the position estimate $\hat{\theta}_e$ being fed back to the means for heterodyning.

14. A motor drive for providing drive power to polyphase AC induction motors of the type which have a stator with stator windings and a uniform rotor, comprising:

(a) drive means, having output supply lines which can be connected to the stator windings, for providing polyphase AC drive power at a fundamental drive frequency to an AC induction motor connected to the output supply lines to receive the AC drive power at a level sufficient to provide magnetic saturation in the stator and for also providing balanced polyphase power to the output supply lines at a signal frequency which is substantially higher than the drive frequency;

(b) sensors connected to the output supply lines sensing the response of the motor to the power provided by the drive means and providing output signals indicative of the response; and (c) a heterodyne demodulator connected to receive the signals from the sensors and mix a signal which is a function of the high signal frequency with the response signals from the sensors to provide a signal indicative of the rotational position of the magnetic flux vector.

15. The motor drive of claim 14 further including a transform circuit means for receiving the signals from the sensors and providing equivalent q-axis and d-axis current signals, and wherein the heterodyne demodulator mixes signals at the high signal frequency with the q-axis and d-axis signals from the transform circuit means to provide a mixed signal to provide the signal indicative of the rotational position of the magnetic flux vector.

16. The motor drive of claim 14 wherein the drive means includes a current regulated inverter connected to provide power to a motor.

17. The motor drive of claim 15 wherein the drive means comprises an inverter connected to the stator windings to provide the AC drive power on supply lines to the stator windings at the fundamental frequency and signal generators coupled to the supply lines to provide power to the stator windings at the signal frequency.

18. The motor drive of claim 15 wherein the motor is a three phase motor having three input lines, wherein the transform circuit means for transforming the detected currents to equivalent q-axis and d-axis currents provides signals $i^s_{qsi}$ and $i^s_{dsi}$, respectively, and the heterodyne demodulator demodulates the current signals to provide a mixed signal $\epsilon$ which is a function in accordance with the expression:

$$\epsilon = i_{qsi}^s \cos(2\hat{\theta}_e - \omega_i t) - i_{dsi}^s \sin(2\hat{\theta}_e - \omega_i t),$$

where $\hat{\theta}_e$ is an existing estimate of the magnetic flux vector position and $\omega_i$ is the signal frequency, and a low pass filter which filters the signal $\epsilon$ to provide a filtered signal $\epsilon_f$ which is a function in accordance with the expression $$\epsilon_f = I_{i1} \sin[2(\theta_e - \hat{\theta}_e)]$$

where $I_{i1}$ is an equivalent current level and $\theta_e$ is the actual position.

19. The motor drive of claim 18 wherein the measuring means further includes a tracking filter controller receiving the filtered signal $\epsilon_f$, the controller providing a selectively weighted and conditioned version of the signal $\epsilon_f$ which is used to provide output signals which are estimates of magnetic flux vector speed $\hat{\omega}_e$ and position $\hat{\theta}_e$, the position estimate $\hat{\theta}_e$ being fed back to the means for heterodyning.

20. A method of determining the rotational position of the magnetic flux vector in an AC induction motor comprising the steps of:

(a) providing a polyphase motor including a stator with a plurality of stator windings thereon, and a rotor mounted for rotation within the stator, the rotor being uniform such that the impedance as seen by the stator windings does not substantially vary as a function of the rotational position of the rotor;

(b) providing balanced AC drive power to the stator windings at a fundamental drive frequency of the motor at a level sufficient to provide magnetic saturation in the stator;

(c) providing balanced AC power to the stator windings at a signal frequency which is substantially higher than the drive frequency; and (d) measuring the response of the stator windings to the signal frequency power to determine the variation of the response as a function of time during operation of the motor whereby the angular position of the magnetic flux vector as a function of time or the speed of the flux vector or both can be determined from the variation of the response during operation of the motor.

21. The method of claim 20 wherein the step of measuring the response of the stator windings includes the steps of mixing a signal which is a function of the high signal frequency with the current from the stator windings and low pass filtering the mixed signal to provide a signal indicative of the rotational position of the magnetic flux vector.

22. The method of claim 20 wherein the motor is a three phase motor having three input lines, wherein the step of measuring the response includes the steps of detecting the currents in the input lines to the motor, transforming the detected currents to equivalent q-axis and d-axis current signals $i^s_{qsi}$ and $i^s_{dsi}$, respectively, heterodyning the current signals to provide a mixed signal $\epsilon$ which is a function in accordance with the expression:

$$\epsilon = i^s_{qsi} \cos(2\hat{\theta}_e - \omega_i t) - i^s_{dsi} \sin(2\hat{\theta}_e - \omega_i t),$$

where $\hat{\theta}_e$ is an existing estimate of the magnetic flux vector position and $\omega_i$ is the signal frequency, and low pass filtering the signal $\epsilon$ to provide a filtered signal $\epsilon_f$ which is a function in accordance with the expression $$\epsilon_f = I_{i1} \sin[2(\theta_e - \hat{\theta}_e)]$$

where $I_{i1}$ is a current amplitude and $\theta_e$ is the actual magnetic flux vector position.

23. The method of claim 22 including the step of providing a selectively weighted and conditioned version of the signal $\epsilon_f$, using it to provide output signals which are estimates of flux vector speed $\hat{\omega}_e$ and position $\hat{\theta}_e$, and feeding back the position estimate $\hat{\theta}_e$ to the step of heterodyning.

24. A motor drive system comprising:
(a) a linear induction motor including a primary and a secondary, the primary and secondary movable linearly with respect to each other, the secondary magnetically coupled to the primary, the secondary being uniform such that the impedance as seen by the primary does not vary as a function of the relative position of the primary and secondary;
(b) drive means, connected to the primary, for providing AC drive power to the primary at a fundamental drive frequency of the motor which is at a level sufficient to provide magnetic saturation in the primary and for also providing power to the primary at a signal frequency which is substantially higher than the drive frequency; and
(c) means for measuring the response of the primary to the signal frequency power to determine the variation of the response as a function of time during operation of the motor whereby the relative linear position of the magnetic flux vector with respect to the primary can be determined.

25. The motor drive system of claim 24 wherein the drive means includes an inverter having a plurality of switching devices connected in a bridge configuration and control means for controlling the switching of the switching devices to provide AC power to the primary, wherein the control means controls the switching of the switching devices of the inverter in a pulse width modulated manner at a high switching frequency to provide pulse width modulated output power which includes a component at the fundamental drive frequency and a component at the high signal frequency.

26. The motor drive system of claim 24 wherein the means for measuring the response of the primary to signal frequency power includes a heterodyne demodulator mixing a signal which is a function of the high signal frequency with the response from the primary to provide a signal indicative of the relative position of the magnetic flux vector with respect to the primary.

* * * * *